United States Patent [19]
Chavan et al.

[11] Patent Number: 5,929,497
[45] Date of Patent: Jul. 27, 1999

[54] BATCH PROCESSED MULTI-LEAD VACUUM PACKAGING FOR INTEGRATED SENSORS AND CIRCUITS

[75] Inventors: Abhijeet V. Chavan; Kensall D. Wise, both of Ann Arbor, Mich.

[73] Assignee: Delco Electronics Corporation, Kokomo, Ind.

[21] Appl. No.: 09/096,263

[22] Filed: Jun. 11, 1998

[51] Int. Cl.⁶ ................................................. H01L 29/82
[52] U.S. Cl. .......................................... 257/417; 257/254
[58] Field of Search .................................... 257/417, 418, 257/787, 254, 710

[56] References Cited

U.S. PATENT DOCUMENTS

| | | | |
|---|---|---|---|
| 3,686,542 | 8/1972 | Rindner et al. | 257/418 |
| 3,736,475 | 5/1973 | Berner | 257/787 |
| 4,184,189 | 1/1980 | Davis et al. | 361/283 |
| 4,261,086 | 4/1981 | Giachino et al. | 29/25.41 |
| 4,345,299 | 8/1982 | Ho | 361/283 |
| 4,386,453 | 6/1983 | Giachino et al. | 29/25.41 |
| 4,773,972 | 9/1988 | Mikkor | 204/16 |
| 5,200,363 | 4/1993 | Schmidt | 437/208 |
| 5,266,827 | 11/1993 | Kato | 257/417 |
| 5,352,852 | 10/1994 | Chun | 174/52.4 |

OTHER PUBLICATIONS

Abhijeet V. Chavan, & Kensall D. Wise, "A Multi–Lead Vacuum–Sealed Capacitive Pressure Sensor", 1998 Solid State Sensor & Actuator Workshop, Hilton Head, S.C., Jun. 7, 1998.

Abhijeet V. Chavan & Kensall D. Wise, "A Batch–Processed Vacuum–Sealed Capacitive Pressure Sensor", Digest IEEE Int. Conf. on Solid–State Sensors and Actuators (Transducesr '97), Chicago, pp. 1449–1452, Jun. 1997.

"Absolute Pressure Sensors by Air–Tight Electrical Feedthrough Structure" from Sensors and Actuators, A21–A23 (1990) pp. 1048–1052.

*Primary Examiner*—Carl Whitehead, Jr.
*Assistant Examiner*—S. V. Clark
*Attorney, Agent, or Firm*—Jimmy L. Funke

[57] ABSTRACT

A semiconductor device that uses polysilicon as an electrostatic bonding medium and as a lead transfer for multiple lead connection to one or more electrical devices within a vacuum sealed chamber. A semiconductor region, such as a heavily built P++ silicon region, is bonded to a glass substrate of the device. The semiconductor region includes a recess that defines a chamber between the semiconductor region and the substrate. Multiple internal electrodes or lead transfers within the chamber pass through separate electrical connection regions in a polysilicon sealing layer that seals the semiconductor region to the substrate. In one embodiment, each of the separate electrical connection regions includes an upper polysilicon region and a lower polysilicon region separated by a dielectric layer. The lower polysilicon region includes a first separate polysilicon region electrically connected to one of the internal leads and a second separate polysilicon region electrically connected to an external lead. Holes are formed in the dielectric layer so that the first and second separate polysilicon regions are electrically connected to the upper polysilicon region. A sealing polysilicon region positioned between the first and second separate polysilicon regions provides the seal, and is electrically isolated from the first and second polysilicon regions. Therefore, the combination of the first polysilicon region, the upper polysilicon region and the second polysilicon region forms a bridge over the sealing polysilicon region to electrically connect the internal lead to the external lead. Isolation trenches are provided in the upper polysilicon region to electrically separate the electrical connection regions.

25 Claims, 12 Drawing Sheets

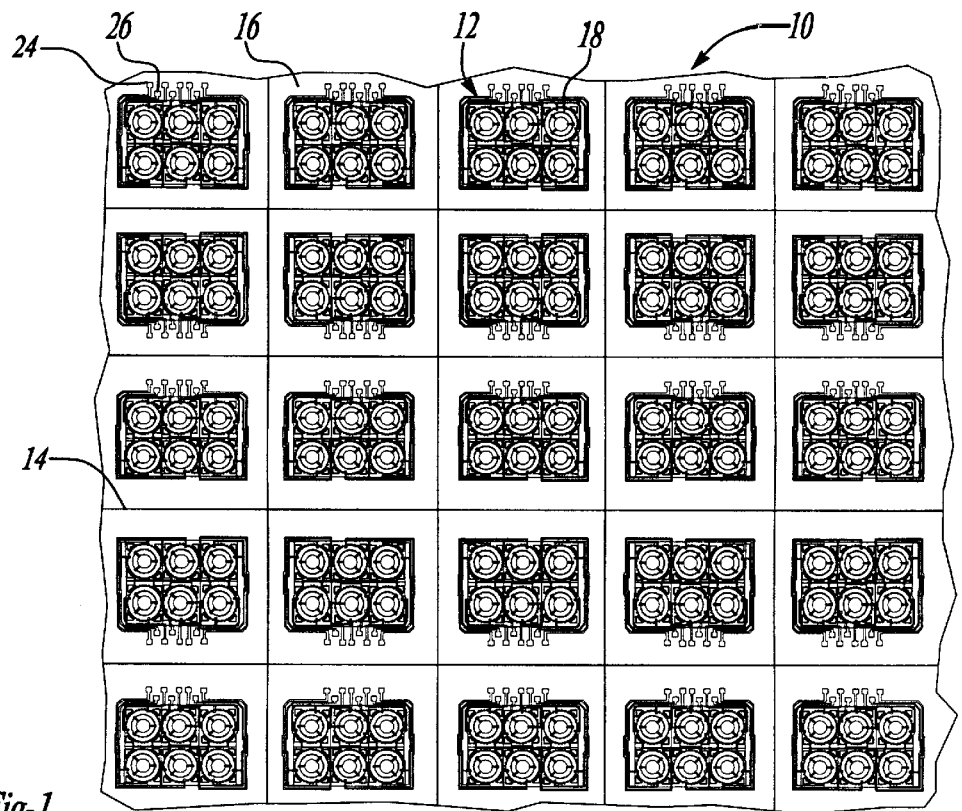
_Fig-1_
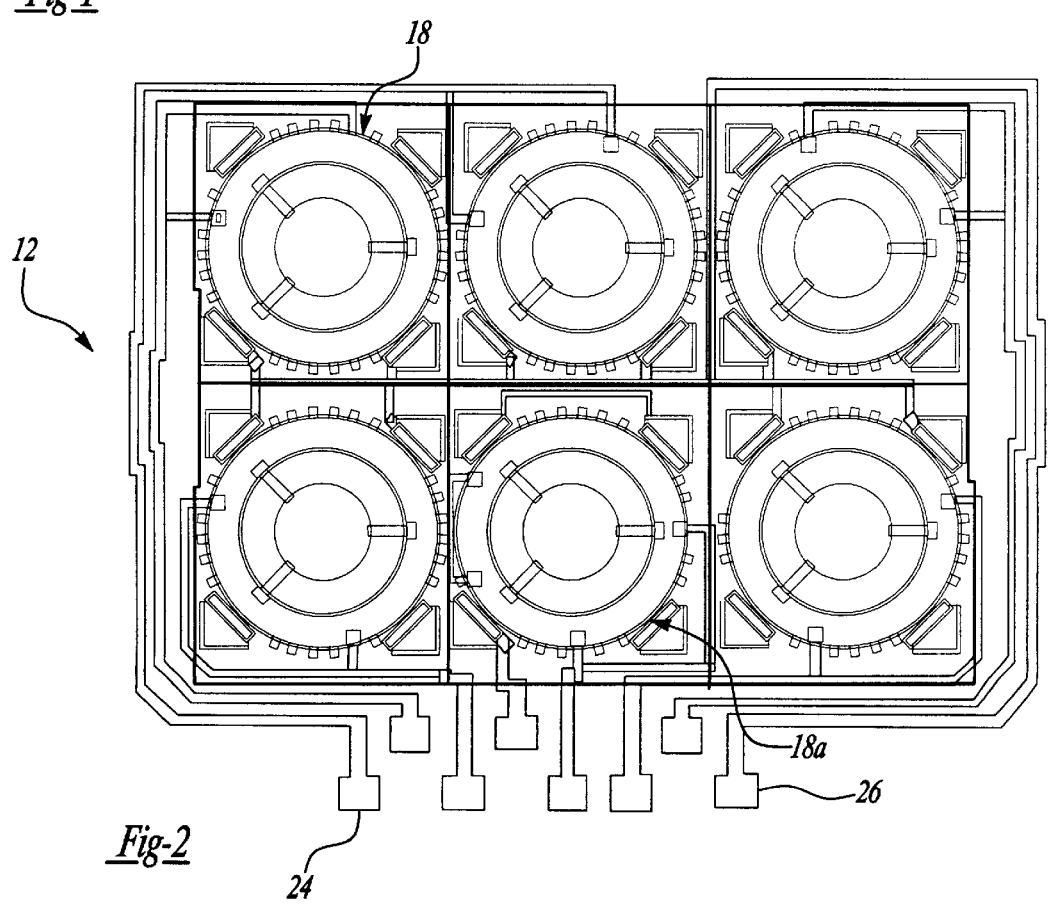
_Fig-2_

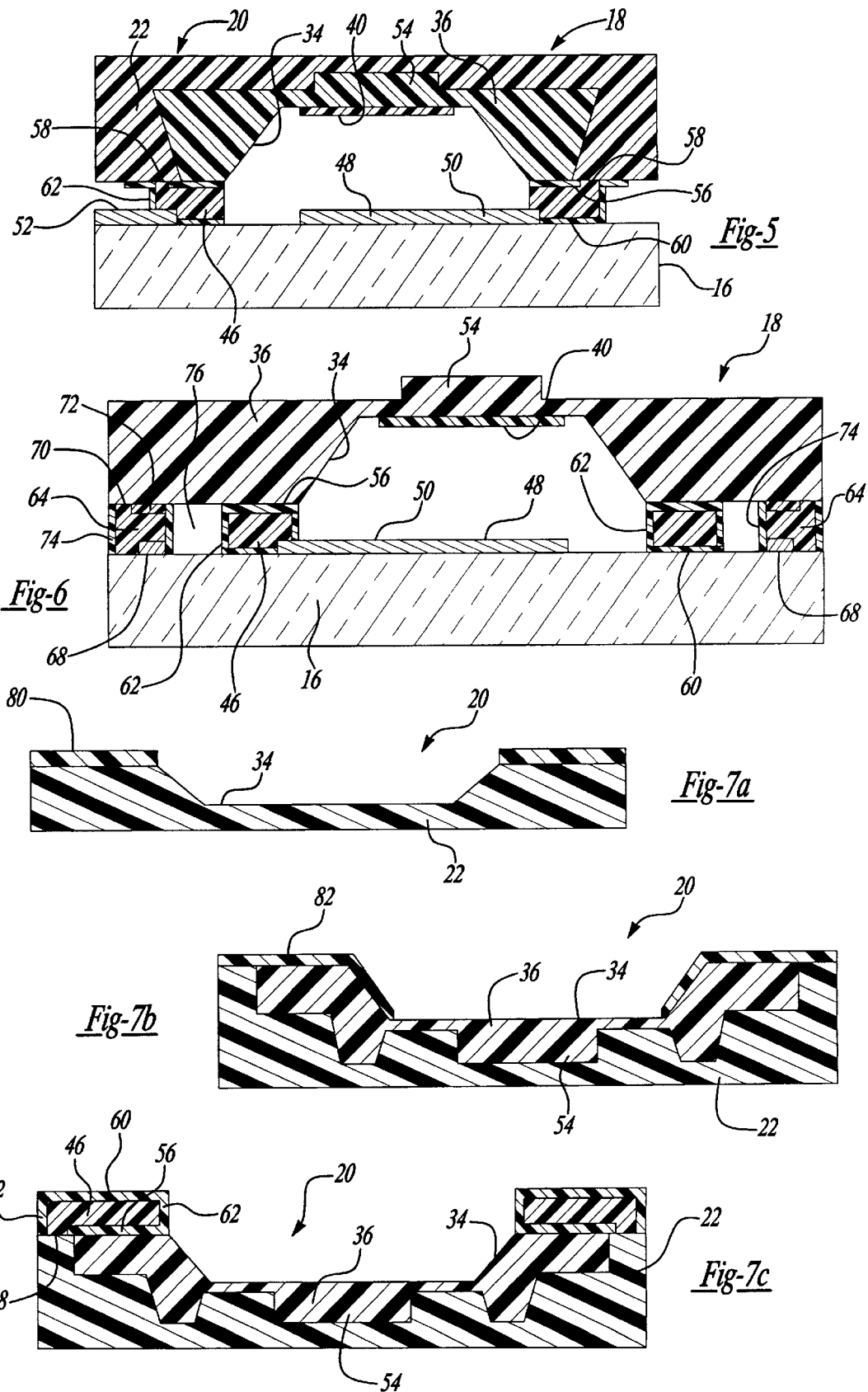

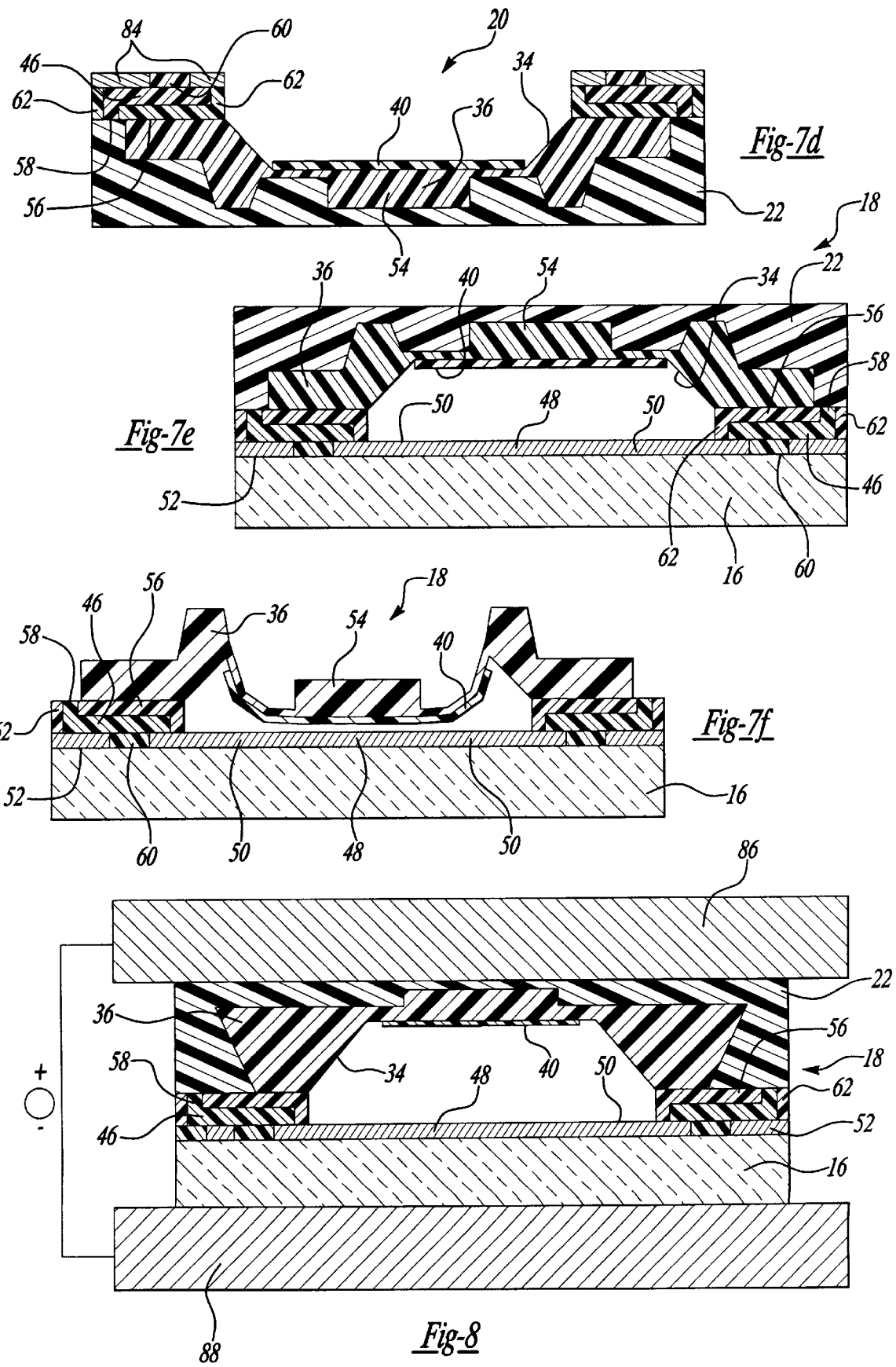

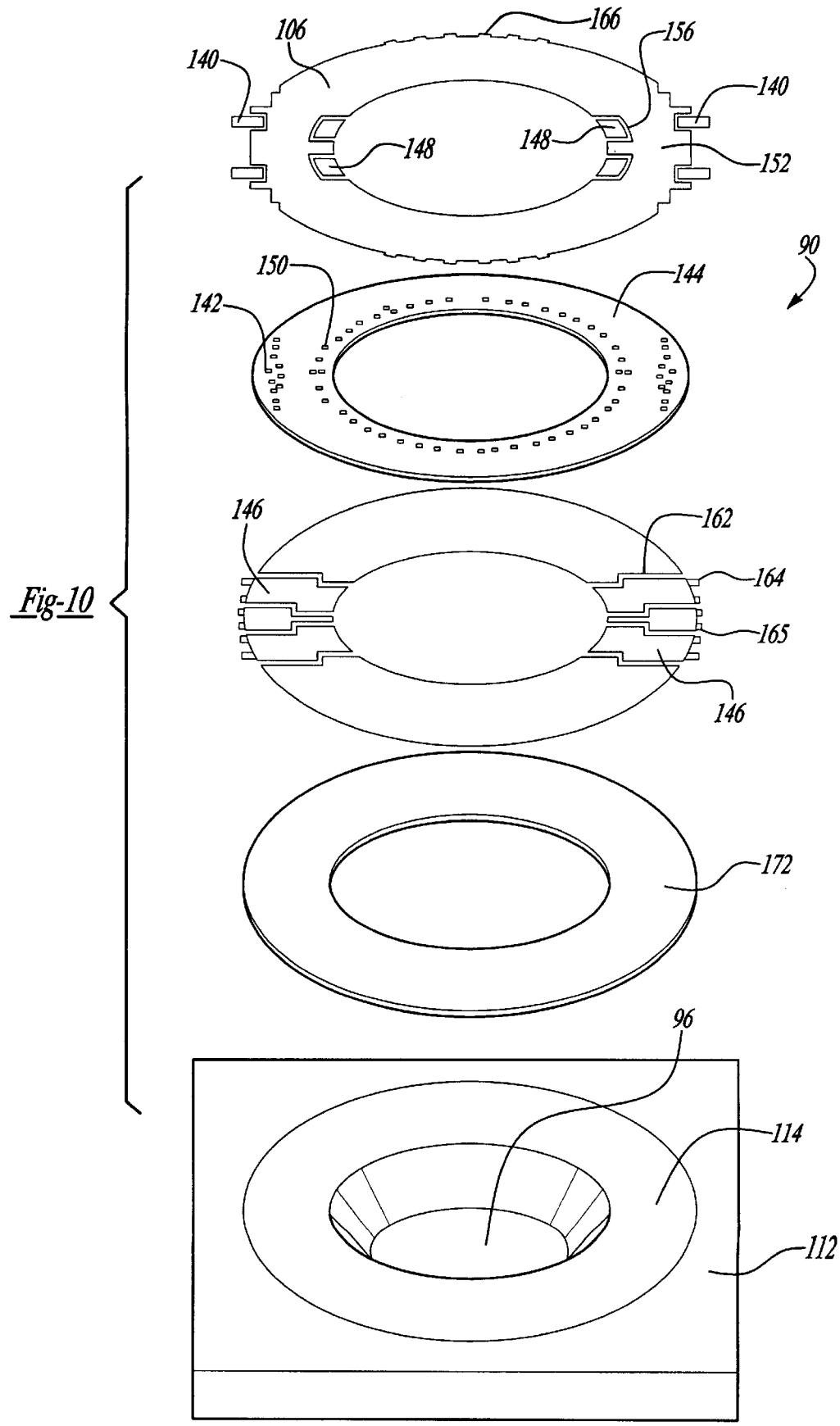

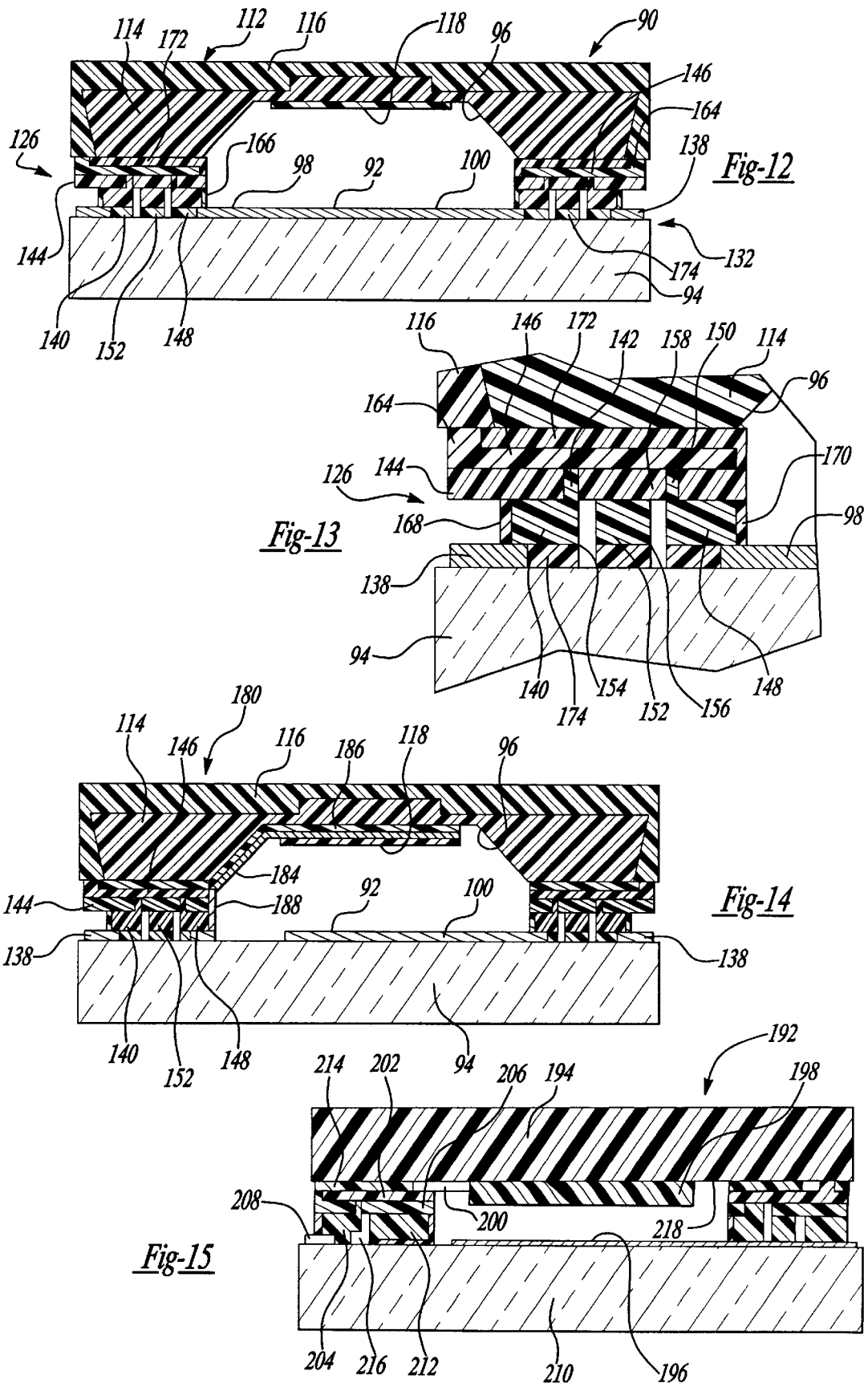

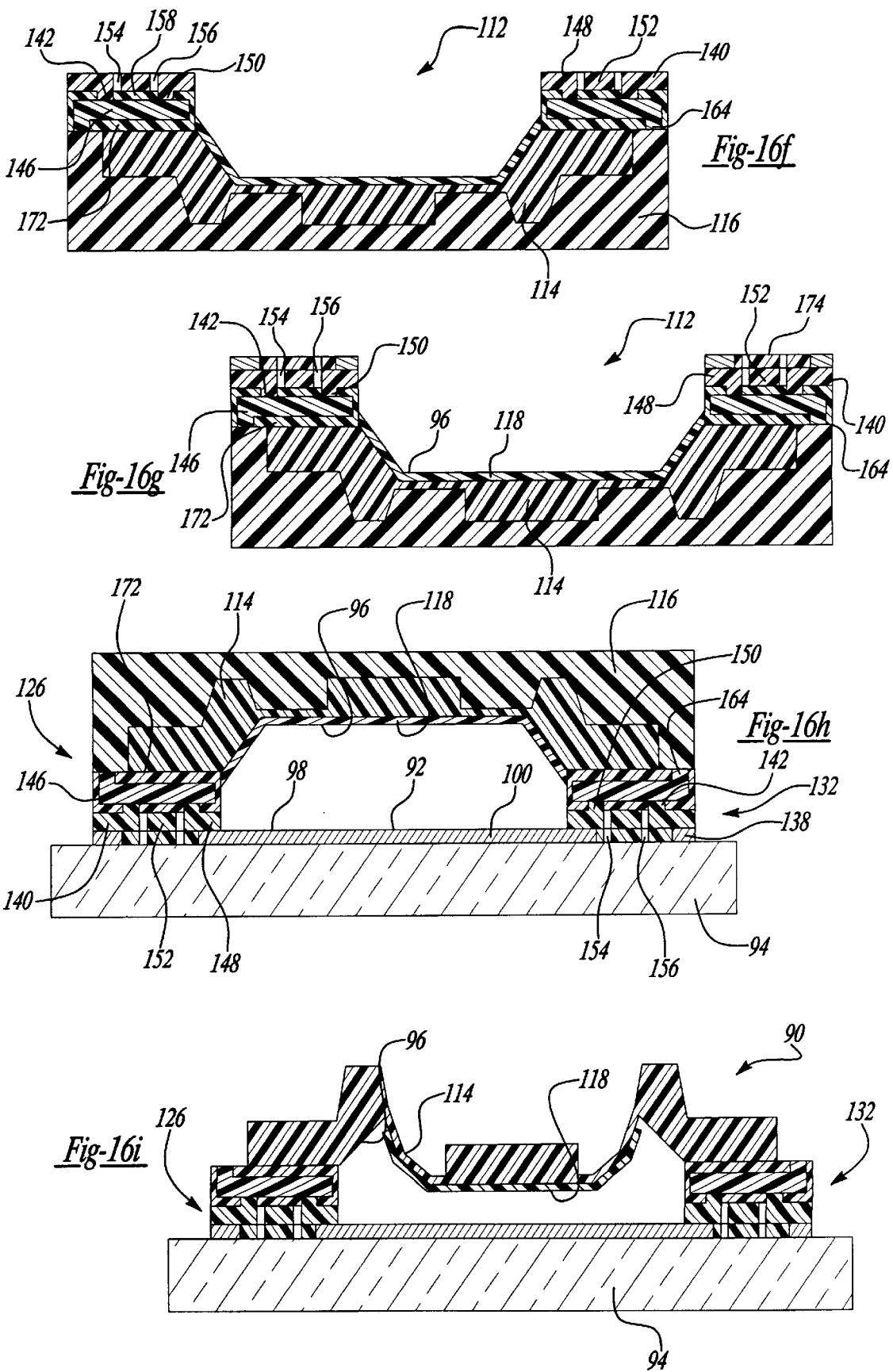

BATCH PROCESSED MULTI-LEAD VACUUM PACKAGING FOR INTEGRATED SENSORS AND CIRCUITS

The United States Government may have certain rights in this invention pursuant to the grant under Contract No. DABT63-95-C-011 from the DARPA.

BACKGROUND OF THE INVENTION

1. Field of the Invention

The present invention relates generally to a semiconductor device including multiple leads connected to an electrical device within a vacuum-sealed chamber and, more particularly, to a batch processed, semiconductor device including an electrostatically sealed chamber in which an electrical device within the chamber includes multiple electrical leads electrically isolated and extending through the chamber.

2. Background of the Related Art

The need for highly sensitive, miniature-sized pressure transducers is important for incorporation into microelectromechanical systems (MEMS) devices. Pressure transducers of this type have many applications, including uses in motor vehicles. One motor vehicle application requires the use of pressure sensors for measuring both ambient and subatmospheric pressure levels. In internal combustion engine applications, fine control of fuel metering has required that the rapidly-fluctuating pressure levels within the intake manifold of the engine be measured as well as the less-rapidly fluctuating ambient pressure levels. Sensors able to measure these pressures reliably and with adequate response time have been difficult to obtain and are typically expensive.

A majority of the currently employed pressure sensors are piezoresistive devices, well known to those skilled in the art. However, capacitive pressure sensor devices are becoming increasingly more of the focus in the industry because of their higher pressure sensitivity, lower temperature sensitivity, and reduced power consumption. Because piezoresistive devices can be more cheaply produced and are currently more reliable, they remain, however, the more popular of the known pressure sensors. Research continues on the capacitive pressure sensor devices to reduce their cost of manufacture and increase their reliability because of their inherent advantages.

Many variations of capacitive pressure sensors are known in the art. Capacitive pressure sensors typically measure pressure by the capacitive changes resulting from variations in the distance between a movable diaphragm and a substrate that occur because of pressure changes. A vacuum sealed chamber is defined in the sensor, where an internal electrode is formed on the substrate within the chamber and an external electrode is formed as part of the movable diaphragm. As the pressure outside of the chamber increases or decreases, the diaphragm moves towards or away from the substrate, and the charge on the electrodes changes giving an indication of the pressure change.

One area that has prevented capacitive pressure sensors from becoming more reliable is the ability to provide an electrical connection to the internal electrode within the sealed chamber in an inexpensive and reliable manner using batch processing techniques without effecting the seal integrity. Other types of semiconductor devices, such as accelerometers, gyroscopes, resonators, etc., incorporating a circuit or multiple electrodes within a sealed chamber could also benefit from such an electrical connection to the interior of a vacuum chamber. There has been much work in the industry to connect a lead to the internal electrode in an effective manner to overcome this problem. In one example, a hole is formed through a glass substrate to expose the electrode, and then a lead is electrically connected to the electrode through the hole, and the hole is then filled with an appropriate conductive filler material. U.S. Pat. Nos. 4,345,299 and 4,773,972 disclose two types of capacitive pressure sensors that make contact to the electrode within the sealed chamber in this manner.

While the various known techniques of connecting an external lead to the electrode within the chamber are generally successful in accomplishing this goal, these techniques allow considerable room for improvement. What is needed is a capacitive pressure sensor that is cost-effective, reliable and robust, and includes an improved technique for electrically connecting a lead to an electrode within a vacuum chamber associated with the transducer. It is therefore an objective of the present invention to provide such a sensor.

SUMMARY OF THE INVENTION

In accordance with the teachings of the present invention, a semiconductor device is disclosed that uses polysilicon as an electrostatic bonding medium and as a lead transfer for multiple lead connections to one or more electrical devices within a vacuum sealed chamber. A semiconductor region, such as a heavily doped P++ silicon region, is bonded to a glass substrate of the device. The semiconductor region includes a recess that defines a chamber between the semiconductor region and the substrate. Multiple internal electrodes or lead transfers within the chamber pass through separate electrical connection regions in a polysilicon sealing layer that seals the semiconductor region to the substrate. In one embodiment, each of the separate electrical connection regions includes an upper polysilicon region and a lower polysilicon region separated by a dielectric layer. The lower polysilicon region includes a first separate polysilicon region electrically connected to one of the internal leads and a second separate polysilicon region electrically connected to an external lead. Holes are formed in the dielectric layer so that the first and second polysilicon regions are electrically connected to the upper polysilicon region. A sealing polysilicon region positioned between the first and second separate polysilicon regions provides the seal, and is electrically isolated from the first and second polysilicon regions. Therefore, the combination of the first polysilicon region, the upper polysilicon region and the second polysilicon region forms a bridge over the sealing polysilicon region to electrically connect the internal lead to the external lead. Isolation trenches are provided in the upper polysilicon region to electrically separate the electrical connection regions.

In alternate embodiments where the internal leads are positioned on the semiconductor region, the internal leads can make direct contact with the upper polysilicon region and one of the first or second lower polysilicon regions can be eliminated.

Additional objects, advantages, and features of the present invention will become apparent from the following description and appended claims, taken in conjunction with the accompanying drawings.

BRIEF DESCRIPTION OF THE INVENTION

FIG. 1 is a cut-away plan view of a semiconductor wafer assembly including a plurality of separate pressure sensor arrays fabricated on the wafer;

FIG. 2 is a top elevation view of one of the pressure sensor arrays separated from the wafer shown in FIG. 1;

FIG. 5 is a cross-sectional view of the pressure sensor shown in FIG. 4 through line 5—5 in FIG. 4;

FIG. 6 is a cross-sectional view of the pressure sensor shown in FIG. 4 through line 6—6 of FIG. 4;

Figure 4:
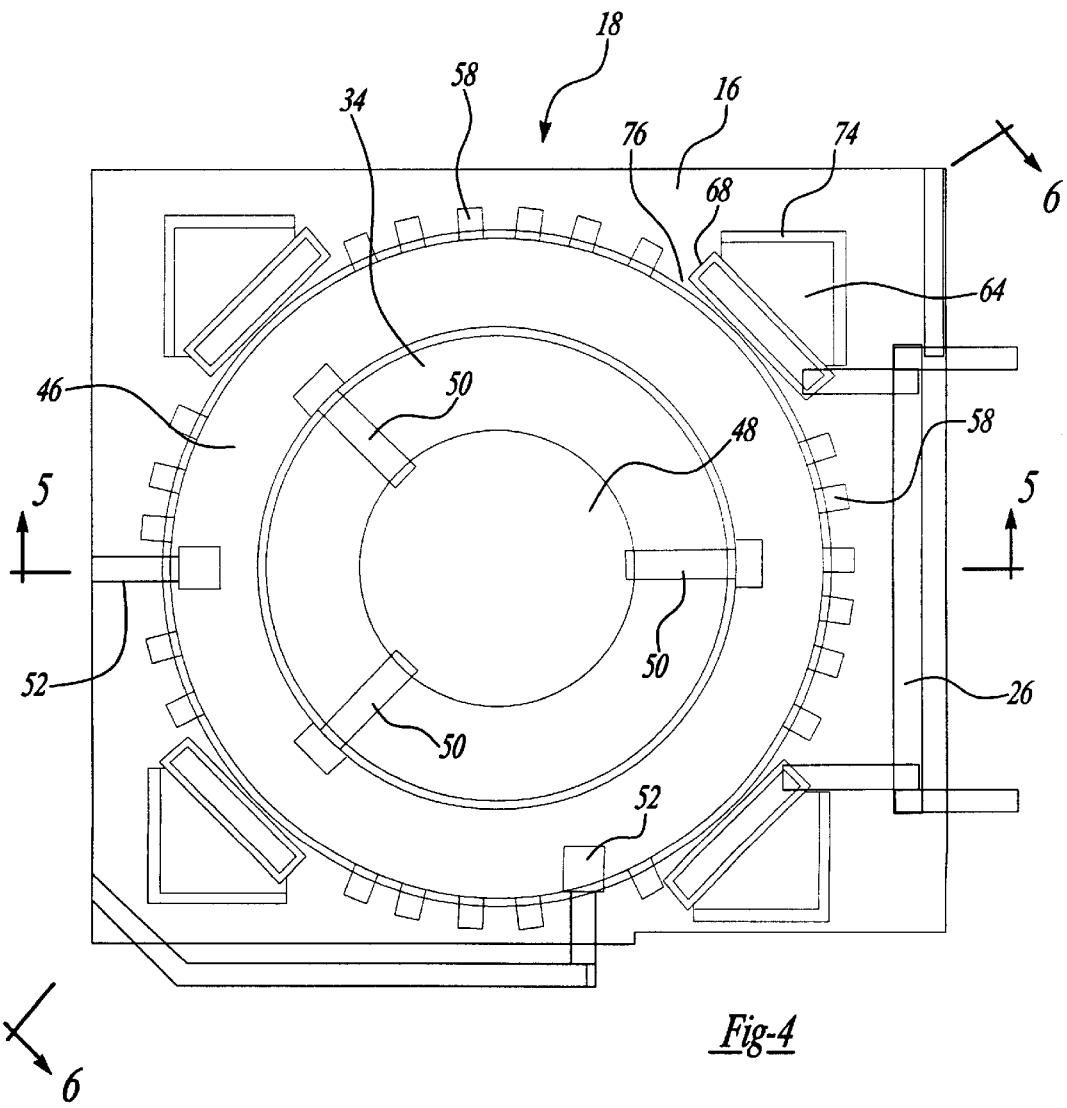
FIG. 4 is a top plan view of a single pressure sensor of the pressure sensor array shown in FIG. 2.
Figure 9:
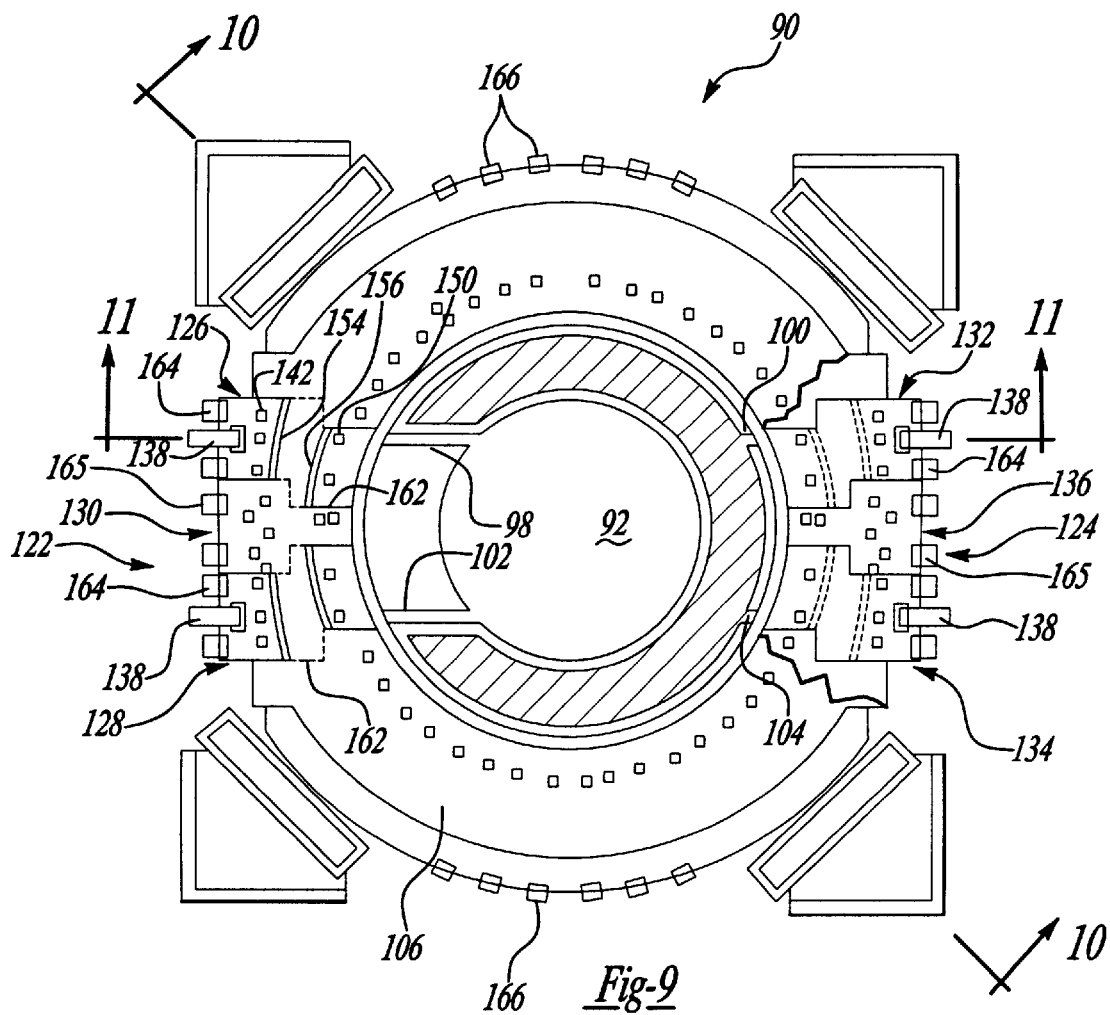
Figure 11:
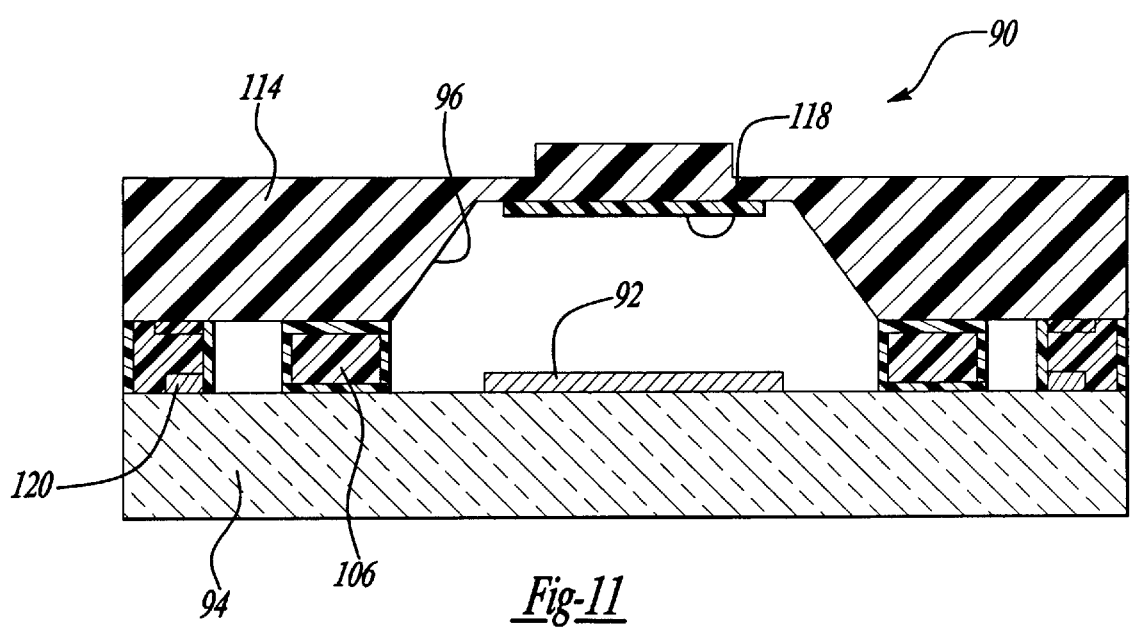

FIGS. 7(a)–7(f) are cross-sectional views of various fabrication steps for making the pressure sensor shown in FIG. 4;

FIG. 8 is a cross-sectional view of an electrostatic bonding fabrication step of the pressure sensor shown in FIG. 4, where the pressure sensor is sealed to a glass substrate;

FIG. 9 is a bottom plan view of a semiconductor device according to another embodiment of the present invention;

FIG. 10 is an exploded view showing various layers of the semiconductor device shown in FIG. 9;

FIG. 11 is a cross-sectional view of the semiconductor device shown in FIG. 9 through line 11—11 of FIG. 9;

FIG. 12 is a cross-sectional view of the semiconductor device shown in FIG. 10 through line 12—12;

FIG. 13 is an enlarged cut-away cross-sectional view of an electrical connection through the seal of the semiconductor device shown in FIG. 11;

FIG. 14 is a cross-sectional view of a semiconductor device according to another embodiment of the present invention;

FIG. 15 is a cross-sectional view of a semiconductor device according to another embodiment of the present invention;

FIGS. 16(a)–16(i) are cross-sectional views of various fabrication steps for making the semiconductor device shown in FIG. 9; and FIGS. 17(a)–17(j) are cross-sectional views of various fabrication steps for making a semiconductor device according to another embodiment of the present invention.

DETAILED DESCRIPTION OF THE PREFERRED EMBODIMENTS

The following description of the preferred embodiments directed to a capacitive pressure sensor and various semiconductor devices is merely exemplary in nature, and is in no way intended to limit the invention or its applications or uses.

FIG. 1 is a schematic type diagram of a micromachined, batchprocessed, wafer assembly 10 including a plurality of pressure sensor arrays 12 formed on a glass substrate 16 suitable for bonding to silicon. The sensor arrays 12 are separated from each other by dicing along lines 14. Only a portion of the wafer assembly 10 is shown, with the understanding that the wafer assembly 10 is typically circular or square in nature and accommodates a large number of sensor arrays 12 depending on the specific diameter of the assembly 10 for a particular processing application. In one embodiment, the glass substrate 16 is SD2 HOYA or 7740 PYREX, however, other glasses suitable for anodic bonding may be equally applicable. FIG. 2 is a top elevation view of one of the pressure sensor arrays 12 separated from the assembly 10. Each sensor array 12 includes six separate capacitive pressure sensors 18 of varying degrees of sensitivity to provide a pressure measurement over a wide range of pressures. The sensitivity of the individual pressure sensors 18 is determined by the relative diameter and thickness of the diaphragm in the sensor 18. Most of the components of all of the sensor arrays 12 are formed and micromachined on a common P-type silicon wafer 20 having moderate resistivity (see FIGS. 5 and 6), but are not limited to this types of wafer. The wafer 20 is then electrostatically bonded to the glass substrate 16 in a batch-type process, as will be described in more detail below. The electrostatic bonding process is well known to those skilled in the art. A lightly doped silicon region 22 of the silicon wafer 20 is then etched away, for example, by an EDP (ethylenediamine pyrocatechol) etch to separately define the individual sensor arrays 12 from each other while they are still mounted on the glass substrate 16. Once the separated arrays 12 are completely fabricated, the glass substrate 16 is diced along the lines 14 to separate the arrays 12 from each other. A more detailed discussion of the fabrication process will be discussed below, but the general fabrication steps of forming a capacitive pressure sensor in this manner is known in the art.

Figure 3:
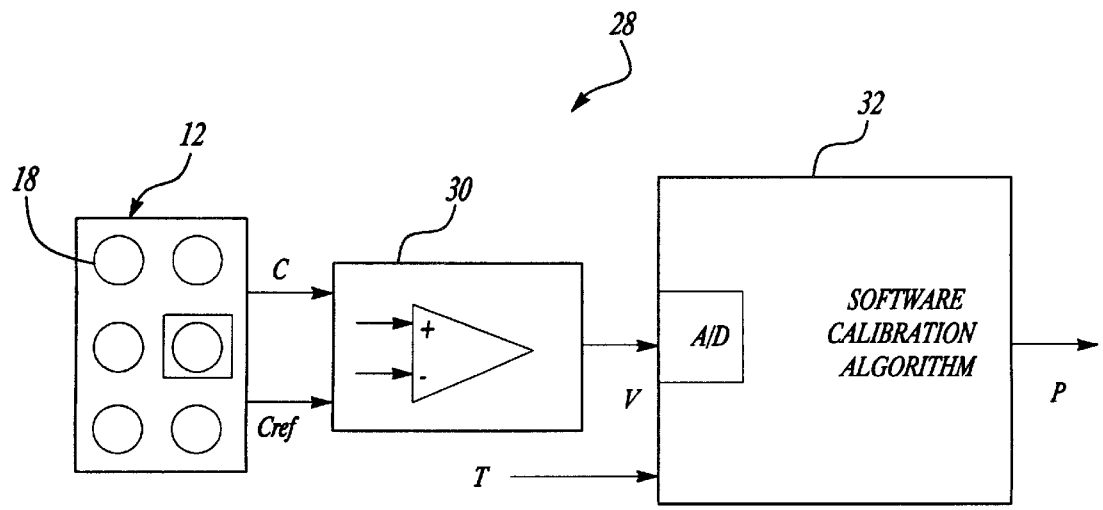
FIG. 3 is a schematic view of a pressure sensor system including a pressure sensor array of the type shown in FIG. 2, a switched capacitor readout circuit and a microcontroller.

Each of the sensors 18 provide an electrical indication of the pressure around the sensor 18. Each sensor 18 includes at least one electrical lead 24 connected to one electrode of a capacitor and at least one lead 26 connected to another electrode of the capacitor, as will be discussed below. FIG. 3 is a schematic diagram of a pressure circuit 28 including one of the sensor arrays 12. Each of the sensors 18 provides analog electrical output signals or any other capacitance to voltage or current conversion indicative of the surrounding pressure on the leads 24 and 26 to a switched capacitor or any other capacitance to voltage or current conversion circuit 30 that amplifies the signals. One of the sensors 18(a) provides a reference pressure signal indicative of a constant reference pressure. The amplified output signals are applied to a microcontroller 32 that converts the analog signals to digital signals and processes the digital signals to be displayed on a suitable display (not shown). A pressure circuit of the type shown here would be well understood to those skilled in the art, and forms no part of the present invention.

FIG. 4 is a top elevation view of one of the sensors 18, FIG. 5 is a cross-sectional view of the sensor 18 through line 5—5 of FIG. 4, and FIG. 6 is a cross-sectional view of the sensor 18 through line 6—6 of FIG. 4. The wafer 20 is etched to define a cavity 34. The wafer 20 includes the lightly doped silicon region 22 and a heavily doped P++ silicon region 36 that acts as a movable diaphragm and conductive electrode for a capacitor of the sensor 18. The electrode 36 has the configuration as shown to conform with the semiconductor fabrication processes used to make the sensor 18. FIGS. 4 and 6 show the sensor 18 after the lightly doped silicon region 22 has been etched away, and the diaphragm electrode 36 remains. FIG. 5 shows the sensor 18 before the lightly doped silicon region 22 has been etched away. FIG. 4 depicts the sensor 18 as if the diaphragm electrode 36 was transparent. The electrode 36 is formed by any suitable doping process known in the art, such as diffusion or ion implantation of boron. The relative thickness of the region 22 and the electrode 36 is not shown accurately proportionate in that the thickness of the region 22 may be on the order of 480 $\mu$m and the thickness of the electrode 36 may be on the order of 20 $\mu$m. A dielectric layer 40, such as silicon dioxide, is formed on the diaphragm 36 within the cavity 34, as shown, by a suitable deposition step, such as chemical vapor deposition. According to the invention, as will be described in more detail below, the wafer 20 is electrostatically bonded to the substrate 16 by a polysilicon sealing layer 46 that extends completely around the cavity 34. Because the assembly 10 is fabricated within a vacuum chamber, the cavity 34 is sealed as a vacuum by the layer 46. Although the discussion herein will refer to the sealing layer 46 as being made of polysilicon in a preferred embodiment, other materials or combination of materials can make up the sealing layer 46. For example, instead of polysilicon, silicide, e.g. silicide of molybdenum, tantalum, tungsten, polysilicides, refractory metals, or combinations thereof can also be used.

Prior to the wafer 20 being sealed to the substrate 16, a series of metal electrode layers, such as Titanium-Platinum-Gold (Ti/Pt/Au) layers, are formed on a surface of the substrate 16 and etched to define an internal electrode 48 and internal leads 50 within the cavity 34, and external leads 52 outside of the cavity 34. The internal leads 50 make an electrical connection with the internal electrode 48 within the cavity 34. The external leads 52 are electrically connected to the lead 24. An electrical connection between the internal leads 50 and the external leads 52 must be provided without affecting the seal integrity. In accordance with the teachings of the present invention, the polysilicon layer 46 also acts as an electrical connection between the internal lead 50 and the external lead 52 through the seal provided by the layer 46. Therefore, the layer 46 maintains the vacuum integrity of the cavity 34 while at the same time providing an electrical connection through the vacuum seal. Three separate internal leads 50 are electrically connected to the internal electrode 48 and to the sealing layer 46, and two separate external leads 52 are electrically connected to the sealing layer 46 and the lead 24, as shown in FIG. 4. This is for reliability purposes in the event that one of the internal leads 50 or the external leads 52 is defective as a result of the fabrication process.

The three conductive layers (Ti/Pt/Au) that make up the electrode 48 and the leads 50 and 52 offer a number of advantages. The titanium layer is deposited on the substrate 16 to provide good adhesion of the electrodes 48 and the leads 50 and 52 to the substrate 16. The titanium layer also reacts with oxygen escaping from the substrate 16 to prevent the oxygen from adding pressure to the cavity 34. The platinum layer is deposited on the titanium layer to enclose the titanium layer to prevent the titanium layer from dissolving during the EDP wafer etch. Platinum is selected because it is highly conductive, inert, has a low resistance. Titanium bonds well to the polysilicon layer 46. The gold layer is deposited on the platinum layer and offers a highly conductive material that readily bonds to wires and other contacts. It is noted that the use of titanium, platinum, and gold are by way of a non-limiting example in that other conductive materials and combinations of conductive materials also may be applicable.

Because the cavity 34 is under a vacuum when the region 22 is etched away, the diaphragm electrode 36 compresses in response to an atmospheric external pressure. The diaphragm electrode 36 and the internal electrode 48 act as plates of a capacitor and the cavity 34 acts as a dielectric. When a potential is applied to the electrodes 36 and 48 the capacitance formed by them changes based on the pressure outside of the cavity 34 because the diaphragm electrode 36 moves closer to or farther away from the electrode 48 in a proportional manner, in response to the changes in the external pressure. The dielectric layer 40 prevents the electrodes 36 and 48 from contacting each other if the external pressure gets to be too great and the two electrodes touch each other, to prevent a short circuit. A thickened diaphragm area 54 also helps to flatten the diaphragm electrode 36 when it is under compression, and helps to linearize the capacitance. (See FIG. 7(f)).

Because the layer 46 provides an electrical connection to the electrode 48, it must be electrically isolated from the electrode 36. Therefore, a dielectric insulating layer 56, for example a combined layer of silicon oxide/silicon nitride/silicon oxide ($SiO_2/Si_3N_4/SiO_2$), is formed on the wafer 20 so that it is between the electrode 36 and the sealing layer 46 for electrical isolation purposes. A plurality of buried contact portions 58 of the sealing layer 46, here twenty-two, are defined through the dielectric layer 56, and contact the region 22. The buried contact portions 58 are necessary to achieve an electrical connection between the region 22 and the substrate 16 for proper electrostatic bonding when the wafer 20 is sealed to the substrate 16. The buried contact portions 58 do not contact the electrode 36, and therefore, when the region 22 is etched away, the buried contact portions 58 do not interfere with the capacitance between the electrodes 36 and 48. The buried contact portions 58 allow batch production of the sensor assemblies 12 on the common substrate 16. An isolation dielectric coating layer 60 is provided between the polysilicon layer 46 and the substrate 16, and isolation dielectric coating layers 62 are defined around the polysilicon layer 46. The combination of the dielectric layers 56, 60 and 62 enclose the polysilicon layer 46, and prevent it from being attacked during the EDP etch that dissolves the region 22.

Electrical connection from the lead 26 to the diaphragm electrode 36 is made at the corners of the sensor 18, as illustrated in FIG. 6. A polysilicon contact region 64 makes electrical contact with the diaphragm electrode 36 and an external metal lead 68 fabricated on the glass substrate 16. The external lead 68 makes electrical contact with the lead 26. The contact region 64 makes electrical contact with the diaphragm electrode 36 through an opening 70 in a dielectric layer 72. The polysilicon region 64 is surrounded by a dielectric protection layer 74 to prevent the region 64 from being etched away during the EDP etch that dissolves the region 22. A space 76 is provided between the sealing layer 46 and the polysilicon region 64 for isolation purposes.

The sensor 18 is fabricated using bulk micromachining technology, particularly, a ten mask bulk-micromachined dissolved wafer process. FIGS. 7(a)–7(f) depict the sensor 18 at a series of fabrication steps in the production of the sensor 18 with the understanding that these fabrication steps are on a batch level in that the entire assembly 10 is being made. First, the cavity 34 is etched into the silicon wafer 20 by a KOH recess etch at 85° C. for 9.2 minutes, using an appropriately patterned oxide mask 80, such as silicon dioxide, as shown in FIG. 7(a). The cavity 34 is etched into the wafer 20 to the required deflection distance of the diaphragm defined by the electrode 36. Small variations in this depth can be compensated in later dielectric deposition steps. The KOH etch is adaptable to any required depth. This cavity can also be formed using other silicon etchants, like EDP, TMAH (tetra metyl amonium hydroxide), etc., or could be formed using anisotropic RIE dry etch. The wafer 20 is then patterned with a masking oxide and etched again, and a solid-source boron diffusion is performed at 1175° C., or other types of diffusion suitable to form etch stops, to define the P++ region for the electrode 36. A nominal diffusion depth of 12.5 µm is obtained. The mask is removed and another oxide mask 82 is patterned, and a shallow boron diffusion is performed to defined the diaphragm electrode thickness to about 2.4 µm. The wafer 20 is shown after these steps in FIG. 7(b). Both of the above steps can be performed with different process parameters.

Next, a chemical vapor deposition (LPCVD) process is performed to deposit the $SiO_2/Si_3N_4/SiO_2$ dielectric layer 56 to a total thickness of 1 μm. The layer 56 is then patterned and openings in the layer 56 are defined by a suitable etch to expose the wafer 20 for the contact portions 58. Then the polysilicon layer 46 is deposited. A short boron diffusion between 950° C. and 1050° C. is then performed to reduce the resistance of the polysilicon layer 46. The boron diffusion also reduces the rate of EDP attack if the protective dielectric coating layers 56, 60 and 62 on the polysilicon layer 46 are defective. An optional chemical mechanical polishing (CMP) step can be used to achieve a higher yield during vacuum bonding. The CMP step reduces the roughness of the layer 46 below 7 nm and also helps overcome yield loss due to minor wafer bowing which may occur in earlier high temperature steps. It is necessary to adopt proper cleaning procedures after the CMP step to remove heavy metals from the polishing slurry embedded in the polished surface. Other options to dope the polysilicon include using in-situ doped polysilicon or ion implantation. The polysilicon layer 46 is then patterned using an $SF_6$ or other plasma. The dielectric layer on the diaphragm electrode 36 is then removed using a wet etch. A 70–80 nm thick CVD $Si_3N_4$ or $SiO_2$ layer forming the coating layer 60 is then deposited on the polysilicon layer 46 to protect it from attack by the EDP. The wafer 20 is shown after these steps in FIG. 7(c).

The dielectric layer 40 is deposited and patterned so that only the electrode 36 within the cavity 34 is covered. The dielectric layer 60 is then patterned and etched to provide for contact openings. The wafer 20 is then patterned again using photoresist and Ti-Pt contacts 84 are evaporated to fill the openings and contact the polysilicon layer 46 to a total height of about 50 nm. At this point, the polysilicon layer 46 is completely enclosed by a dielectric layer and has two metal contact layers. Due to the loss of some polysilicon during boron diffusion and the CMP step, the total height of the dielectric layer and the polysilicon layer 46 is about 2 μm. Thus, the total recess depth of the cavity 34 is 9.8 μm, and functions as the working gap. The wafer 20 is shown to this level of fabrication in FIG. 7(d).

Next, the glass substrate 16 is processed. The glass substrate 16 is patterned using an oxide mask, and consecutive layers of titanium, platinum and gold, or other suitable metal layer combination, are deposited to form the electrode 48 and the internal leads 50. In this example, two internal leads 50 are shown electrically connected to the electrode 48. The gold layer is etched back in the areas that the leads 50 will contact the polysilicon layer 46. The glass substrate 16 is partially diced at this point so that the arrays 12 can be easily separated after the wafer dissolution step. The substrate 16 is then aligned with the wafer 20 as shown in FIG. 7(e).

Next, wafer-level anodic bonding is performed to bond the substrate 16 to the wafer 20 in a vacuum, for example, $1 \times 10^{-6}$ Torr. Due to poor heat transfer in vacuum, it is important to first heat the wafer 20 to 400° C. at $1 \times 10^{-3}$ Torr, and then pump down the chamber to vacuum levels. Preheating the wafer for 20 to 30 minutes helps the outdiffusion of gases from the inner walls of the sealed cavity, which are subsequently evacuated through drainage areas between the cavities. FIG. 8 depicts a cross-sectional view of how the electrostatic bonding is performed. An upper conductive hot plate 86 is positioned on a top surface of the wafer 20 and a lower conductive hot plate 88 is positioned against a surface of the substrate 16 opposite to the wafer 20. A suitable potential is applied to the hot plates 86 and 88 when they are heated, which causes the wafer 20 to be sealed to the substrate 16 by the layer 46, thus vacuum sealing the cavity 34. The bonding voltage and temperature can be varied to obtain an optimum bond in different types of designs, such as 400° C. and a voltage of 1 Kv.

The next step is to dissolve the wafer in EDP to remove the layer 22 to obtain the final structure as shown in FIG. 7(f). As is apparent, the diaphragm 36 is heavily deflected under normal atmospheric conditions. The arrays 12 are then coated with 110nm of parylene, that makes the arrays 12 suitable for applications where condensation can be expected. The parylene coating increases the pressure sensitivity by about 50 to 70 ppm/Torr due to small compressive stresses in the parylene coating. Other coating materials like Teflon can also be used to make the device water resistant. The sensor 18 has wide dynamic range of 600–800 Torr, and high resolution of 25 mTorr, equivalent to an attitude difference of about one foot at sea level. This resolution is maintained over a temperature range from −25° C. to 85° C.

The principals and designs of the capacitive pressure sensor 18 discussed above can be extended to a multi-lead device, for example, multiple electrodes or one or more electrical circuits having multiple outputs, positioned within the vacuum cavity 34 and electrically connected outside of the seal. FIG. 9 shows a bottom plan view, FIG. 10 shows an exploded view, FIG. 11 shows a cross-sectional view through line 11—11 in FIG. 9, and FIG. 12 shows a cross-sectional view through line 12—12 in FIG. 9 depicting a multi-lead device 90 incorporating the teachings of a multi-lead embodiment according to the invention. FIG. 12 shows an enlarged cut-away view of a seal region depicted in FIG. 11. The exploded view in FIG. 10 is shown upside down.

As will be discussed below, the device 90 includes an internal electrode 92 positioned on a glass substrate 94 within a sealed vacuum cavity 96, where multiple internal electrode leads 98, 100, 102 and 104 are separately electrically connected to the internal electrode 92 and electrically isolated when they make an electrical connection through a polysilicon sealing layer 106 that seals the cavity 96. It is understood that this concept can be extended to any more number of additional leads. The design of the device 90 can be extended to multi-lead devices and circuits. It will be apparent that the device 90 includes similar components to the pressure sensor 18. Therefore, the discussion above with reference to the pressure sensor 18 is incorporated into the discussion of the device 90, where relevant. It is noted that the plan view of FIG. 9 is viewed through the glass substrate 94 where the substrate 94 is perfectly transparent.

The device 90 further includes a P-type silicon wafer 112 defining a diaphragm electrode 114, a lightly doped silicon region 116, and an internal dielectric layer 118 that are substantially the same as the like components in the sensor 18. In this embodiment, the internal electrode 92 is connected to the several internal electrode leads 98–104 that must be electrically isolated from each other, and also be transferred through the polysilicon sealing layer 106 without effecting the seal integrity. The cross-sectional view in FIG. 10 is intended to show the electrical connection from the diaphragm electrode 114 to an external lead 120 and is the same as the electrical connection from the electrode 36 to the external lead 68 of the sensor 18 as shown in FIG. 6. Therefore, a discussion of this connection has already been given above.

The continuous sealing layer 106 seals the device 90 along the entire periphery. It consists of a first sealing area 122 on one side of the cavity 96 and a second sealing area 124 on an opposite side of the cavity 96. The first sealing area 122 is separated into a first sealing region 126 and a second sealing region 128, separated by an isolation region 130. Likewise, the second sealing area 124 is separated by a first sealing region 132 and a second sealing region 134, separated by an isolation region 136. FIG. 12 depicts the section regions 126 and 132 along 12—12 to show how the internal leads 98 and 100 pass through the sealing layer 106, and still remain electrically isolated from each other and the internal leads 102 and 104. It will be understood that the other electrodes 102 and 104 are electrically connected through the sealing regions 128 and 134 in the same manner. Only the lead transfer of the region 126 will be described, as shown in FIG. 13, with understanding that the other sealing regions 128, 132 and 134 are the same.

An external lead 138 is fabricated on the glass substrate 94, and is electrically isolated from other external leads 138 connected to the other internal leads 100, 102, 104. The external lead 138 makes electrical contact with a lower outside polysilicon region 140 by a thermocompression bond formed during anodic bonding. The outside polysilicon region 140 includes an extended contact tab 142 that extends through an opening in a dielectric isolation layer 144 and makes electrical contact with an upper polysilicon layer 146. Likewise, a lower inside polysilicon region 148 makes electrical contact with the internal lead 98 within the cavity 96 in a similar fashion. The inside polysilicon region 148 also includes an extended contact tab 150 that extends through another opening in the dielectric layer 144, and also makes electrical contact with the upper polysilicon layer 146. Therefore, it is apparent that the internal lead 98 makes electrical contact with the external lead 138 by the combination of the inside polysilicon region 148, the polysilicon layer 146, and the outside polysilicon region 140. As shown in FIG. 9, the inside polysilicon region 148 and the outside polysilicon region 140 actually make contact with the upper polysilicon layer 146 by multiple openings through the layer 146 for redundancy and reliability purposes.

A center polysilicon region 152 extends between the outside polysilicon region 140 and the inside polysilicon region 148. The center polysilicon region 152 is separated from the outside polysilicon region 140 by an open area 154, and is separated from the inside polysilicon region 148 by an open area 156. During fabrication of the device 90, the outside polysilicon region 140 including the tab contact 142, the inside polysilicon region 148 including the tab contact 150, and the center polysilicon region 152 are patterned and etched as a single polysilicon region. Likewise, the upper polysilicon layer 146 is fabricated as a single polysilicon layer. The center polysilicon region 152 is electrically isolated from the upper polysilicon layer 146 by a center dielectric area 158 of the dielectric layer 144 that extends between the openings in the layer 146. The center polysilicon region 152 makes a continuous seal through the sealing regions 126 and 128, and forms part of the sealing layer 106. The combination of the outside and inside polysilicon regions 140 and 148, the contact tabs 142 and 150, and the upper polysilicon layer 146 forms a bridge over the center polysilicon region 152 to electrically connect the internal lead 98 to the external lead 138. It is the center polysilicon region 152 that is sealed between the glass substrate 94 and the dielectric layer 144 that maintains the seal integrity of the cavity 96 through the sealing areas 122 and 124.

From the discussion above, it has been shown how one of the external leads 138 makes electrical contact with one of the internal leads 98–104 through the sealing layer 106. The center polysilicon region 152 extends across both of the sealing regions 126 and 128 at a lower part of the sealing area 122. A similar center polysilicon region extends across the sealing regions 132 and 134. Clearly, the outside polysilicon region 140, the inside polysilicon region 148 and the upper polysilicon layer 146 must be electrically isolated from the same regions in the other sealing regions 128, 132 and 134. To provide this separation, isolation trenches 162 separate the upper polysilicon layer 146 of the sealing regions 126 and 128. The isolation trenches 162 extend through the upper polysilicon layer 146 and stop when they contact the dielectric layer 144. An isolation trench 162 is provided on both sides of both the sealing regions 126 and 128 so that there is redundancy between each contact area across the polysilicon layer 146. This redundancy defines the isolation region 130 separating the sealing regions 126 and 128. Therefore, each sealing region 126, 128, 132, 134 is separated from the other sealing regions 126, 128, 132, 134 by at least two isolation trenches 162 at an upper location of the sealing regions 126, 128, 132, 134. Additionally, each of the outside polysilicon regions 140 and the inside polysilicon regions 148 at the lower area of the sealing regions 126, 128, 132 and 134 are defined as polysilicon islands that are separated by isolation trenches between the substrate 94 and the layer 144, where the isolation trenches include the open areas 154 and 156, in the same manner as the polysilicon layer 146 at the upper area of the sealing regions 126, 128, 132 and 134. It is only the center polysilicon region 152 that completely extends across the sealing regions 126 and 128, and 132 and 134. And, as discussed above, the electrical contacts from the internal leads 98–104 to the external leads 138 are bridged over the center polysilicon region 152.

The discussion above refers to four separate internal leads making electrical contact through the sealing layer 106, where two internal leads are on opposite sides of the internal electrode 92. Of course, more than four or less than four electrically isolated internal leads can be provided at different locations around the perimeter of the internal electrode 92 within the scope of the invention, as discussed above.

It is noted that the upper polysilicon layer 146 includes a plurality of contact portions 164 at each of the sealing regions 126, 128, 132 and 134, and the isolation regions 130 and 136. Additionally, the polysilicon sealing layer 106 includes contact portions 166 outside of the sealing areas 122 and 124. The contact portions 164 and 166 provide an electrical connection from the region 116 to the glass substrate 94 during electrostatic bonding of the wafer 112 to the substrate 94. As above with the pressure sensor 18, when the region 116 is dissolved in the EDP etch, the contact portions 164 and 166 do not interfere with the electrical connections from the internal leads 98—104 to the external leads 138. In the sealing areas 122 and 124, an electrical connection is made from the contact portions 164 to the upper polysilicon layer 146, through the contact tabs 142 and 150, and through the outside and inside polysilicon regions 140 and 148. As is apparent, contact tabs are also provided in the isolation regions 130 and 136 for this purpose. Also, the outside polysilicon region 140 is protected by a dielectric isolation layer 168 and the inside polysilicon region 148 is protected by a dielectric isolation layer 170 to prevent the polysilicon regions 140 and 148 from dissolving during the EDP etch that dissolves the region 116. Additionally, the upper polysilicon layer 146 is electrically isolated from the diaphragm electrode 114 by a dielectric layer 172 and a dielectric layer 174 is provided between the polysilicon regions 140, 148 and 152 and the substrate 94.

FIG. 14 shows an alternate design of the device 90 according to another embodiment of the present invention, depicted as a semiconductor device 180. FIG. 14 is a cross-sectional view of the device 180 through a line representing line 11—11 in FIG. 9, and thus is similar to the cross-sectional view shown in FIG. 11. Therefore, like components and features are designated with the same reference numeral. The discussion above referring to the electrical isolation for each of the sealing regions 126, 128, 132 and 134 is applicable to the device 180. In this embodiment, the internal electrode 92 makes electrical contact through one of the sealing regions 126, 128, 132 or 134 to the external lead 138. In accordance with the teachings of this embodiment of the invention, an upper internal electrode 184, such as a Ti-Pt-Au electrode discussed above, is formed on a dielectric layer 186. The dielectric layer 186 is fabricated on an inside surface of the diaphragm electrode 114, and the dielectric layer 118 is formed on an opposite side of the electrode 184. An internal lead 188 is electrically connected to the electrode 184 and the inside polysilicon region 148 to make an electrical connection through another one of the sealing regions 126, 128, 132 or 134 to the external lead 138 at an opposite side of the cavity 94. Based on the discussion above, it is clear that the electrodes 92 and 184 are electrically isolated from each other and from the diaphragm electrode 114. Of course, multiple upper electrodes and/or multiple lower electrodes within the cavity 94 can be provided depending on the number of separately isolated sealing regions provided through the sealing layer 106 based on the teachings above.

As mentioned above, a semiconductor circuit can be provided in the cavity 96, and include multiple leads electrically isolated and extending out of the sealing layer 106. In such an embodiment, it is not necessary to provide a movable diaphragm electrode. This embodiment is shown in FIG. 15 depicting a semiconductor device 192. FIG. 15 shows a cross-sectional view of the device 192 through a line substantially the same as line 12—12 of FIG. 9. Although the design of the device 192 is somewhat different than that of the devices 90 and 180, there are significant similarities that will become apparent from the discussion below. In this embodiment, the movable diaphragm 114 is replaced by a silicon substrate 194. The substrate 194 is not movable, and thus the volume of a vacuum cavity 196 remains constant. A semiconductor circuit 198 is fabricated on the surface of the silicon substrate 194 within the cavity 196. A first polysilicon lead 200 extending from the circuit 198 makes electrical contact with an upper polysilicon layer 202, which in turn makes electrical contact with a lower polysilicon region 204 through an opening in a dielectric layer 206. The lower polysilicon layer 206 makes electrical contact with an external electrode 208 formed on a glass substrate 210. A polysilicon sealing layer 212 provides the sealing through the contact areas. The polysilicon layer 202 is isolated from the substrate 194 by a dielectric layer 214, and the polysilicon region 204 is isolated from the sealing layer 212 by an open area 216. Because the circuit 198 is attached to the silicon substrate 194, the inside polysilicon region 148 can be eliminated. As above, any practical number of sealing regions can be provided based on the fabrication limitations to electrically connect a plurality of leads to the circuit 198. Note that the tabs 164 are eliminated in this device to keep the circuit leads isolated during anodic bonding. However, tab contacts 165 and 166 are still present and assist the anodic bonding process. A TiPt electrode 218 (FIG. 15) makes contact to a silicon substrate through tab contact 165/166. A critical function of the tab contact 165/166 in FIG. 15 is to keep the Ti/Pt electrode 218 on the glass substrate 210 at the same potential as the silicon substrate 194 during anodic bonding. This prevents any high voltage field across the vacuum cavity where the circuit is placed, thereby protecting the circuit from detrimental effects of exposure to high electric fields. The various isolation layers and the like shown in the device 192 are known from the discussion above.

Figure 16A:
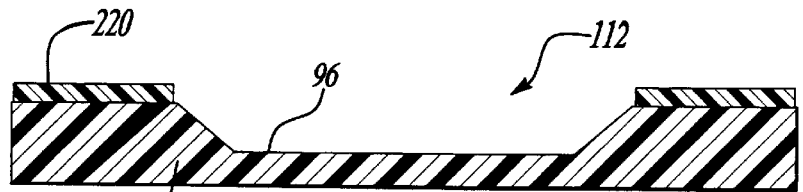
Figure 16B:
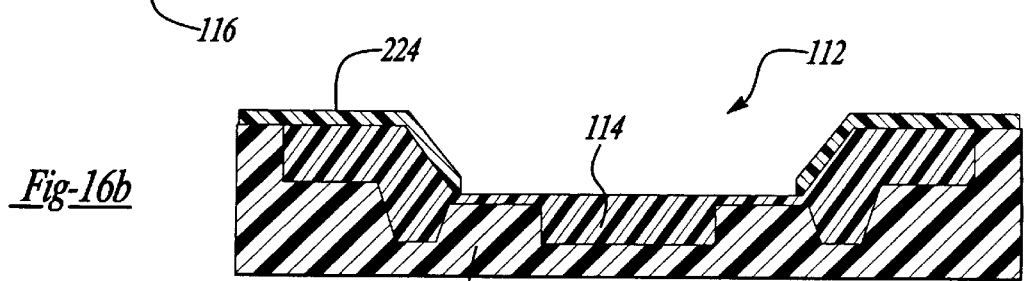

FIGS. 16(a)–16(i) depict cross-sectional views of several of the fabrication steps necessary to make the semiconductor device 90, that are similar to the fabrication steps of the sensor 18 depicted in FIGS. 7(a)–7(f). The semiconductor device 90 is fabricated using a ten-mask bulk-micromachined dissolved wafer process. First, the cavity 96 is etched into the silicon wafer 112 with a KOH recess etch to about 7 μm at 85° C. for 9.2 minutes, using an appropriate patterned oxide mask 220, such as silicon dioxide, as shown in FIG. 16(a). Subsequently deposited layers can compensate for any variation in the etch depth. A patterned oxide mask is used to define the anchor area where the diaphragm electrode 114 is secured to the substrate 94 using a solid-source deep boron diffusion at 1175° C. A nominal diffusion depth of 15 μm is obtained. The mask is removed, and another oxide mask 224 is patterned, and a shallow boron diffusion is then performed to define the thickness of the diaphragm electrode 114 to about 2.4 μm, as shown in FIG. 16(b).

Figure 16C:
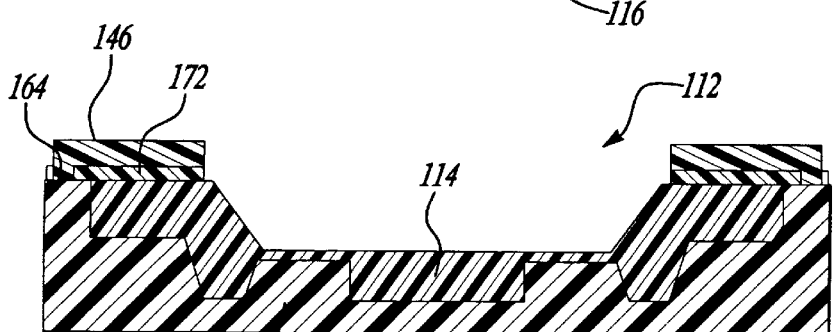

FIG. 16(c) shows the fabrication steps for forming the dielectric layer 172 and the upper polysilicon layer 146, where the dielectric layer 172 is patterned to define the contact portions 164 and 166. The contact openings for the contact portions 164 and 166 are made for the polysilicon layer 146 to make contact to the region 116 along the periphery of the sealing layer 106 to form the contact portions 164 and 166 useful in electrostatic bonding, and along the leads 138 to form the electrical bridges for lead transfer. These steps include the deposition of an LPCVD SiO$_2$/Si$_3$N$_4$/SiO$_2$ layer having a total thickness of 0.75 μm. A short boron diffusion at 1000° C. is then performed to reduce the resistance of the polysilicon layer 146. In addition, P+ doping reduces the rate of attack from the EDP etch if the dielectric coatings around the polysilicon layer 146 are broken. It is adequate to dope polysilicon at low temperatures due to the ease of boron diffusion through the grain boundaries.

Figure 16D:
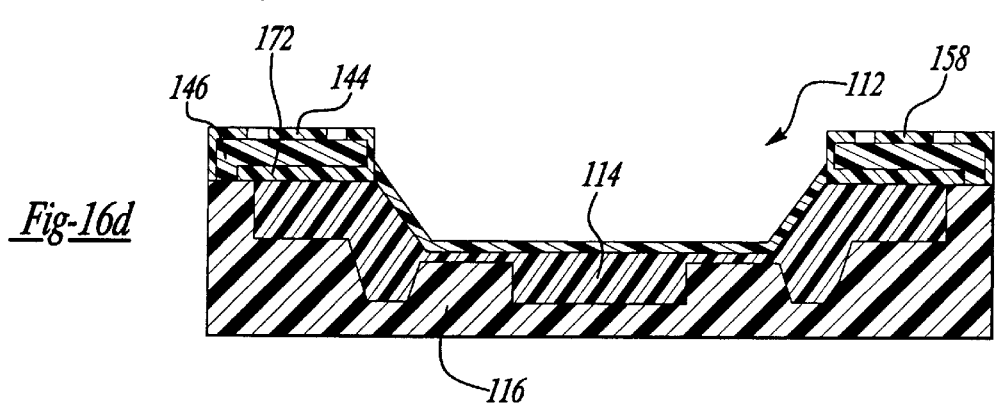

FIG. 16(d) shows the steps of forming the dielectric layer that is patterned and etched to define the dielectric layer 144, including the opening for the contact tabs 142 and 150, and the center dielectric area 158. The polysilicon layer 146 is patterned using a SF$_6$ plasma etching by a two-step lithography process. In the first step, the individual contact tabs 142 and 150 are patterned. This is done on the polysilicon region which is on top of the anchor area. The isolation formed must have straight sidewalls because of the subsequent isolation refill using the SiO$_2$/Si$_3$N$_4$/SiO$_2$ material for the layer 144. In the second etch step, the polysilicon from the cavity 96 is etched. The need for a two-step etch is due to the substantial difference in height for patterns on the anchor area and the patterns in the cavity 94. After etching, the polysilicon and the dielectric are removed using a wet etching. This is followed by a second LPCVD SiO$_2$/Si$_3$N$_4$/SiO$_2$ layer with a total thickness of 0.75 μm.

Figure 16E:
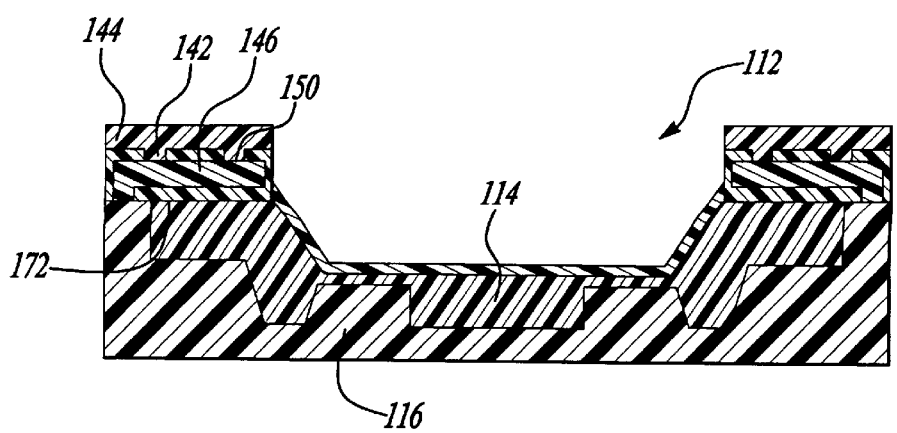

Next, the fabrication steps are performed to deposit the polysilicon layer that makes up the outside polysilicon region 140, the inside polysilicon region 148, and the center polysilicon region 152 as shown in FIG. 16(e). This polysilicon layer is patterned to define the open areas 154 and 156, and depicted in FIG. 16(f). These steps include the deposition of a 1.2 μm-thick layer of polysilicon, which is P++ doped at 1000° C. A CMP step is used to achieve a surface roughness of <500 Å rms and to overcome any non-planarities due to wafer bowing. For polishing silicon, it has been observed that colloidal silica-based slurries give a good surface finish devoid of any scratches and other CMP related defects. It is important to immediately clean the wafers after CMP to avoid any residue, which are difficult to remove once the wafers are dry. The CMP polishing is followed by another $Si_3N_4$ layer of 800 Å thickness, which provides protection to the polysilicon from attack by EDP. Another thin dielectric layer is then deposited on the diaphragm electrode 114 to provide isolation for the two electrodes of the capacitor and provide stress compensation. The dielectric layer on the anchor areas is patterned so as to cover only the anchor area and permit contact openings. Ti-Pt is evaporated so as to contact the polysilicon and produce a total height of about 500 Å. At this point, the polysilicon is completely covered by a dielectric layer and has two metal contact areas. Due to the loss of some silicon during boron diffusion and CMP, the total height of the dielectric layer and polysilicon is about 2.8 μm. Thus, there is a total recess step of about 9.8 μm that forms the working gap distance of the device 90.

The processing of the substrate 94 consists of depositing approximately 250/350/1000 Å of a composite Ti-Pt-Au layer. The Au is then etched back in the contact areas. The glass substrate 94 is partially diced at this point so that the devices 90 can be easily separated after the wafer dissolution step. Next, a wafer-level anodic bonding to glass and vacuum is performed to arrive at the device shown in FIG. 16(h). Due to the poor heat transfer and vacuum, it is important to first heat the wafer to about 400° C. in rough vacuum and then pump down the bonding chamber to higher vacuum levels. Also, preheating the wafers for thirty minutes helps out-diffusion of gases from the inner walls of the sealed cavity 96, which is subsequently evacuated via the recessed areas between cavities when high vacuum is applied. While trying to bond wafers which have discontinuous bond surfaces, a continuous bond front which can pull in a non-uniform parts of wafer cannot be formed, and it is imperative that the surface flatness of the silicon wafer be uniform to obtain a high yield. Use of a graphite disk which covers the entire glass surface and an electrode pressure of at least 2500 mbar also contributes significantly to a better bond yield. The next step is to dissolve the wafer in the EDP etch to obtain the final structure as shown in FIG. 16(i). As is apparent, the diaphragm electrode 114 is heavily deflected under normal atmospheric conditions.

FIGS. 17(a)–17(j) show a series of cross-sectional views of the fabrication steps for making an integrated sensor 228 that incorporates the discussion above, according to a next embodiment of the present invention. The integrated sensor process starts with a silicon wafer 230 suitable for fabrication of CMOS transistors. However, the same process flow can be used to fabricate integrated accelerometers, gyroscopes, resonators and other micro-machined devices which require either a vacuum sealed or a hermetically sealed environment for their operation.

Figure 17A:
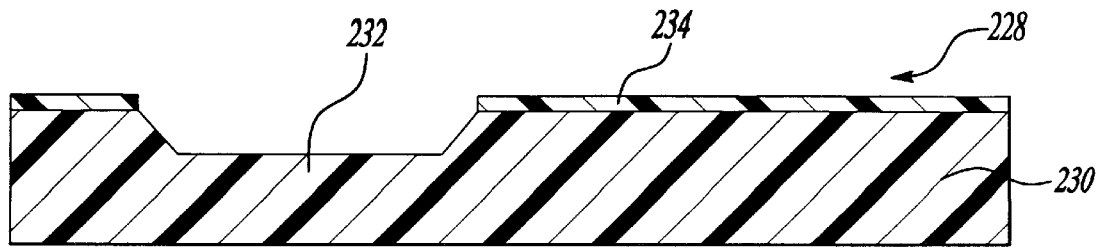
Figure 17B:
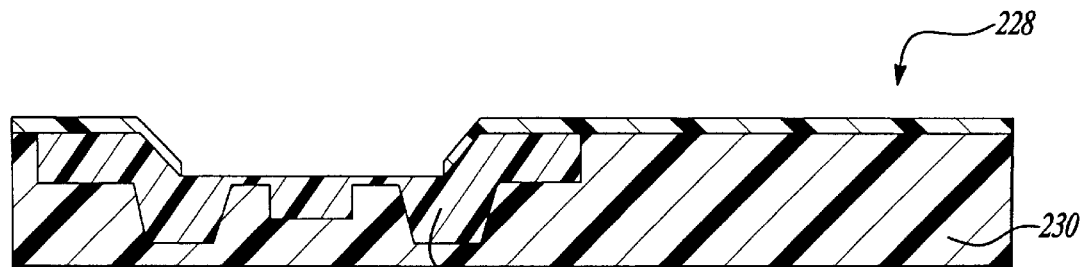
Figure 17C:
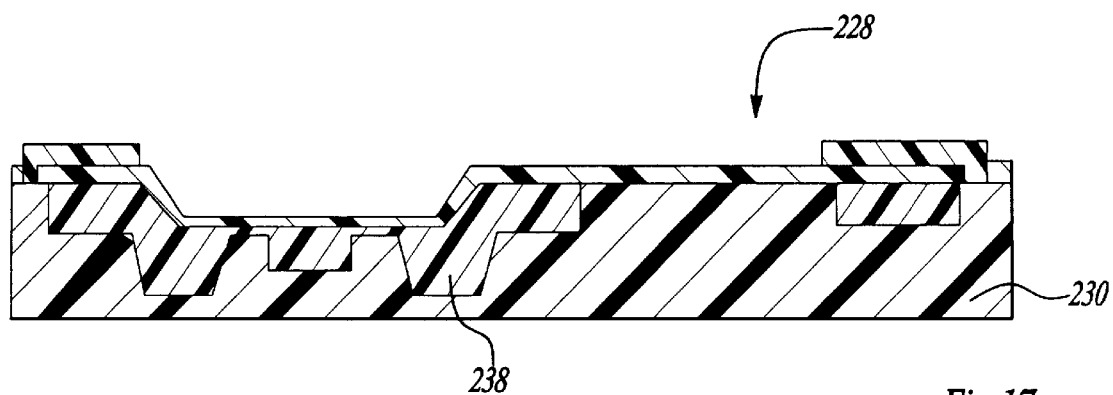
Figure 17D:
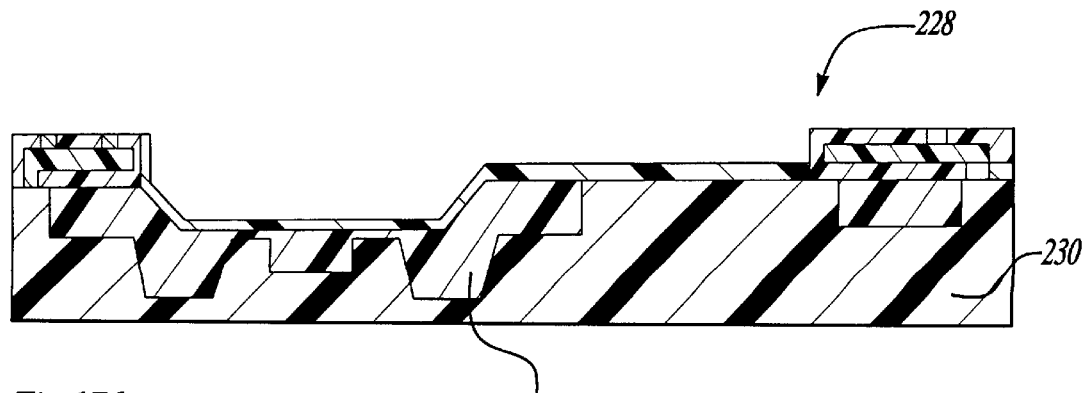
Figure 17E:
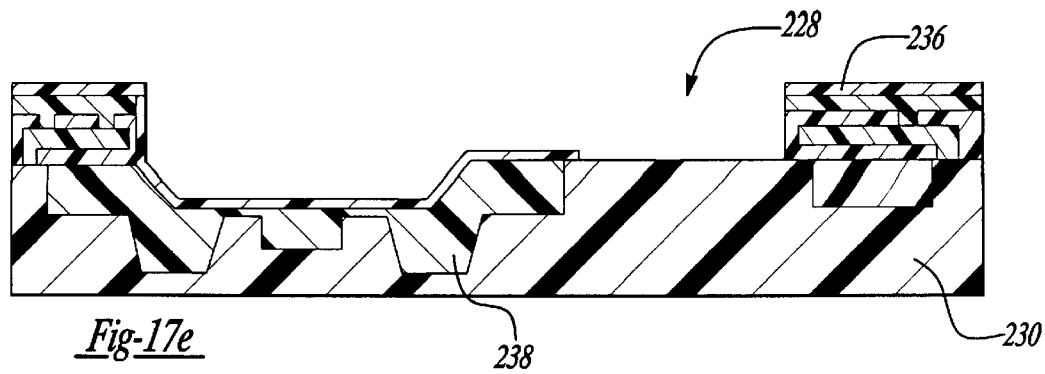
Figure 17F:
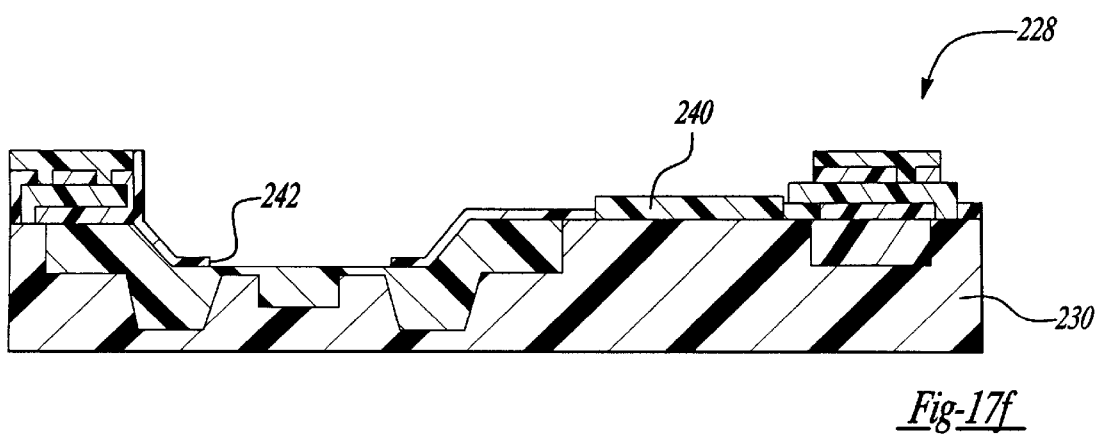
Figure 17G:
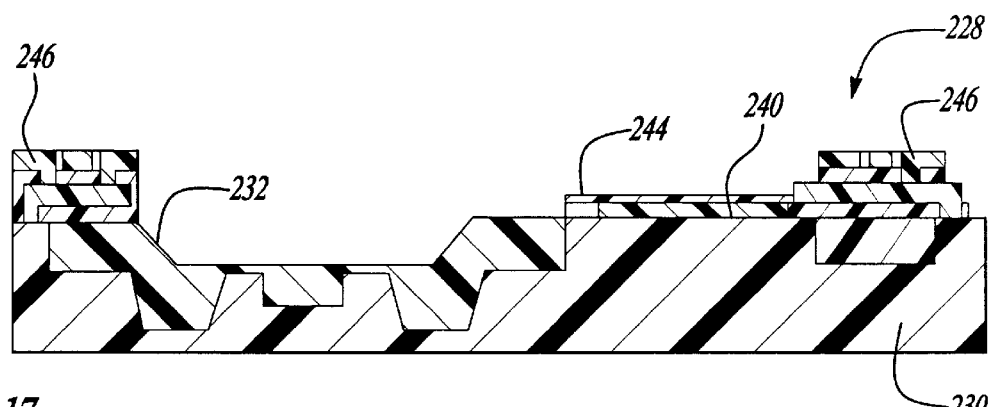
Figure 17H:
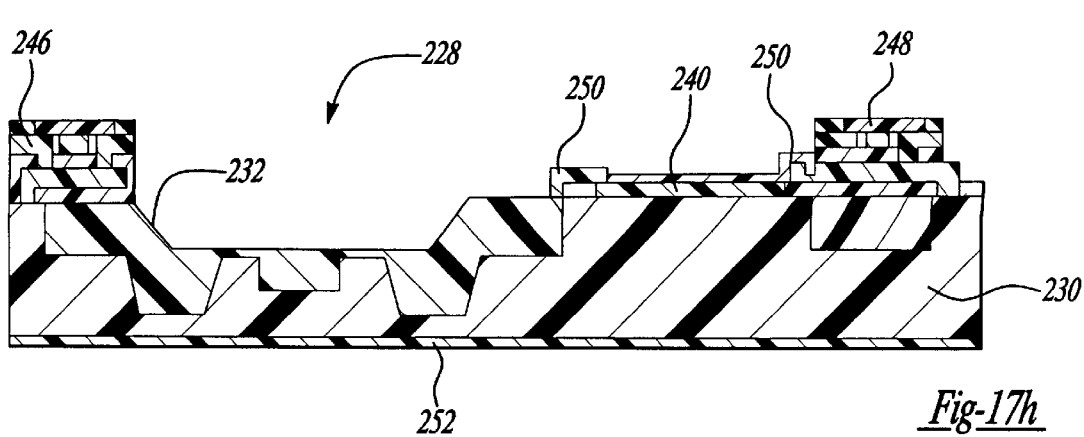
Figure 17I:
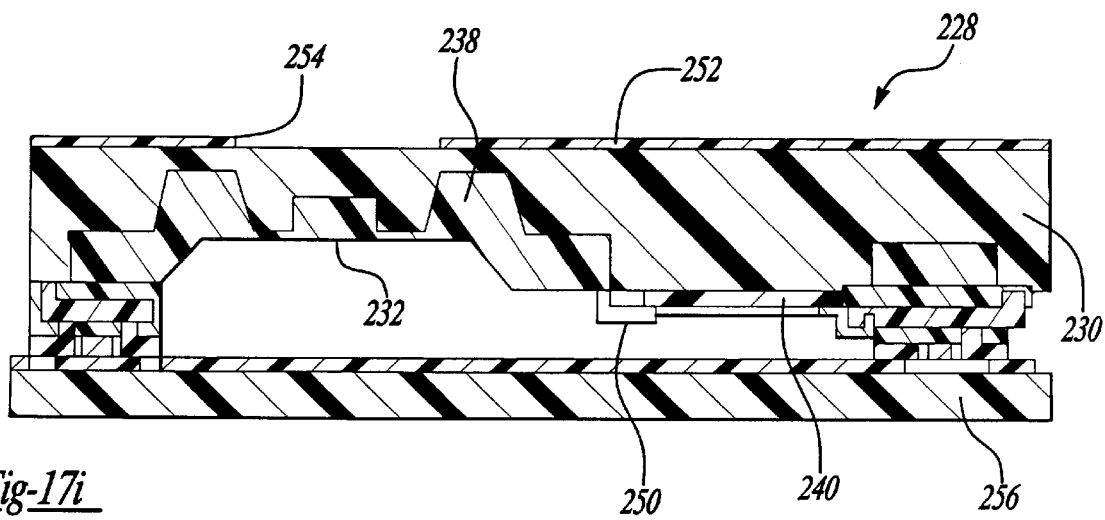
Figure 17J:
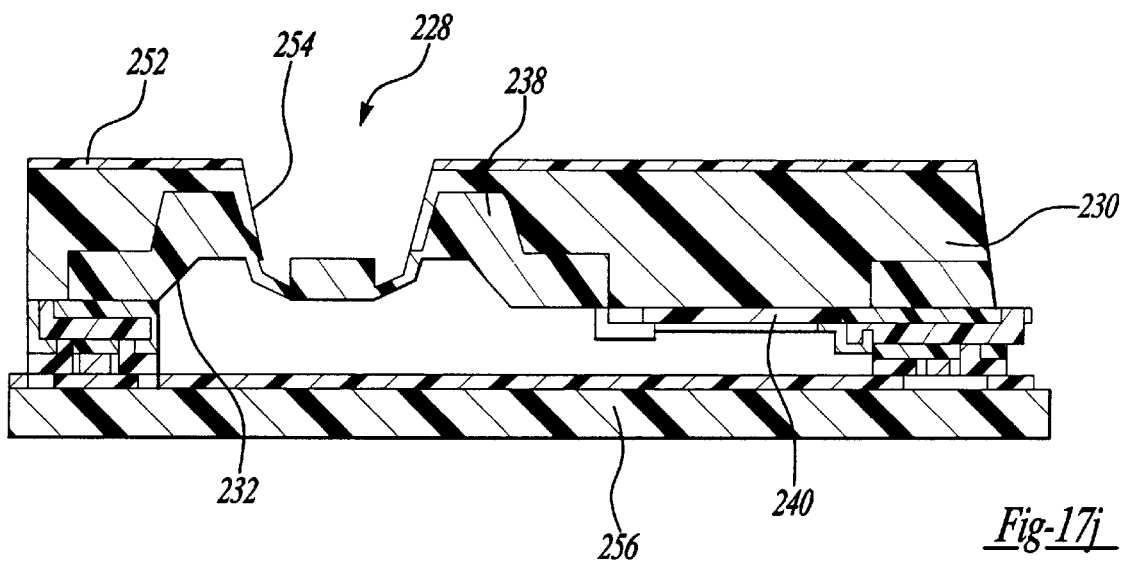

FIG. 17(a) shows the formation of a cavity 232 in the wafer 230 using a KOH etch. The areas outside of the cavity 232 are protected by a thermal oxide layer 234. The fabrication steps of the integrated sensor 228 shown in FIG. 17(b)–17(e) are similar to those described above for the process flow for the multi-lead device discussed in FIGS. 16(a)–16(i). The additional processing to achieve the structure shown in FIG. 17(e) involves the deposition of a final oxide/nitride sandwich layer 236. This helps protect the diaphragm area 238 during fabrication of a CMOS circuit 240. A window 242 is opened on the diaphragm area 238 after a P-well drive-in during fabrication of the CMOS circuit 240. A short boron diffusion is then done to define the diaphragm thickness. These steps are shown in FIG. 17(f). The diaphragm area 238 is then re-covered with an oxide/nitride layer, and the rest of the CMOS fabrication steps are completed. At the end of the CMOS fabrication, the circuit 240 is protected using a 500 Å LTO oxide layer 244. The oxide/nitride layers are then selectively patterned to leave the LTO oxide layer 244 in the circuit area protected during the subsequent CMP step. The CMP results in a smooth poly-1 layer 246 with <500 rms surface roughness. The poly-1 layer 246 is then patterned to complete the formation of the bridge lead transfer structure as explained in the multi-lead process flow above. These steps are shown in FIG. 17(g). Another 500 Å layer 248 of LTO oxide is deposited. Contact openings are made on the circuit 240 and the poly-1 and metallization is done, followed by lift-off to define metal areas 250 as shown in FIG. 17(h). The backside is then metallized 252, and the recess 254 is patterned in the backside metal 252 to match the diaphragm area 238 as shown in FIG. 17(i). The glass substrate 256 is metallized 258 and patterned in a similar way, as described in the process above. Electrostatic bonding is performed on the two wafers and the diaphragm is released in EDP, to form the structure shown in FIG. 17(j).

The various semiconductor devices discussed above provide designs for connecting an electrode or circuit positioned within a vacuum cavity to be electrically connected through the seal of the cavity without effecting the seal entirely. In certain designs, multiple internal electrodes can be electrically connected through the seal and be electrically isolated from each other.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

We claim:

1. A semiconductor device comprising:

a substrate, said substrate including a first external electrode and a second external electrode formed thereon;

a first semiconductor region sealed to the substrate, said first semiconductor region including a recessed area defining a cavity between the substrate and the first semiconductor region;

at least one electrical device positioned within the cavity;

a plurality of internal electrodes positioned within the cavity and being in electrical contact with at least one of the at least one electrical device; and a sealing layer extending around the perimeter of the cavity and sealing the first semiconductor region to the substrate, said sealing layer including a first electrical connection region and a second electrical connection region that are electrically isolated from each other, said first connection region electrically connecting a first internal electrode to the first external electrode and said second connection region electrically connecting a second internal electrode to the second external electrode through the sealing layer.

2. The semiconductor device according to claim 1 wherein the first electrical connection region includes an upper semiconductor region and a lower semiconductor region, said upper and lower semiconductor regions being separated by a first dielectric layer.

3. The semiconductor device according to claim 2 wherein the lower semiconductor region includes an internal lead semiconductor region electrically connected to the first internal lead, an external lead semiconductor region electrically connected to the first external lead and a center semiconductor region, said center semiconductor region being separated from the internal lead semiconductor region by a first lower semiconductor region isolation trench and said center semiconductor region being separated from the external lead semiconductor region by a second lower semiconductor region isolation trench, said center semiconductor region being continuous through the first electrical connection region to provide a seal therethrough.

4. The semiconductor device according to claim 3 wherein the internal lead semiconductor region is in electrical contact with the upper semiconductor region through a first opening in the first dielectric layer and the external lead semiconductor region is in electrical contact with the upper semiconductor region through a second opening in the first dielectric layer so that the first internal lead is in electrical connection with the first external lead, wherein the combination of the internal lead semiconductor region, the upper semiconductor region and the external lead semiconductor region form a bridge over the center semiconductor region.

5. The semiconductor device according to claim 2 wherein the upper semiconductor region is isolated from the first semiconductor region by a second dielectric layer.

6. The semiconductor device according to claim 2 wherein the lower semiconductor region is separated from the substrate by a second dielectric layer.

7. The semiconductor device according to claim 1 wherein the first and second electrical connection regions are electrically separated by isolation trenches formed in the sealing layer.

8. The semiconductor device according to claim 2 wherein the first internal electrode is electrically connected to the upper semiconductor region, and wherein the lower semiconductor region includes an external lead semiconductor region and a sealing semiconductor region, said upper semiconductor region being in electrical contact with the external lead semiconductor region through an opening in the first dielectric layer and said external lead semiconductor region is electrically isolated from the sealed semiconductor region by an isolation trench.

9. A semiconductor device according to claim 8 wherein the first internal electrode is positioned on the first semiconductor region.

10. The semiconductor device according to claim 1 wherein the electrical device is an electrical circuit that includes multiple output leads connected to the plurality of internal electrodes.

11. The semiconductor device according to claim 1 wherein the first semiconductor region is composed of a P++ silicon material.

12. The semiconductor device according to claim 1 wherein the semiconductor sealing layer includes at least one contact tab, said at least one contact tab being positioned adjacent to and electrically isolated from the first semiconductor region, said at lest one contact tab providing an electrical contact between a silicon wafer and the substrate during an electrostatic bonding process that seals the first semiconductor region to the substrate.

13. The semiconductor device according to claim 12 wherein the at least one contact tab is a plurality of separate contact tabs extending around an outer perimeter of the semiconductor sealing layer.

14. The semiconductor device according to claim 1 wherein dielectric isolation layers are positioned between the sealing layer and the substrate and around the outer perimeter of the sealing layer.

15. The semiconductor device according to claim 1 wherein the substrate is a glass substrate.

16. A semiconductor device according to claim 1 wherein the cavity is vacuum sealed.

17. The semiconductor device according to claim 1 wherein the electrical device is selected from the group consisting of accelerometers, sensors, resonators, and gyroscopes.

18. The semiconductor device according to claim 1 wherein the sealing layer is made of a material from the group consisting of polysilicon, silicides, polysilicides, refractory metals, and combinations thereof.

19. A semiconductor device comprising:
a substrate, said substrate including a first external electrode and a second external electrode formed thereon;
a first semiconductor region sealed to the substrate, said first semiconductor region including a recessed area defining a cavity between the substrate and the first semiconductor region;
at least one electrical device positioned within the cavity;
a plurality of internal electrodes positioned within the cavity and being in electrical contact with at least one of the at least one electrical device; and
a semiconductor sealing layer extending around the perimeter of the cavity and sealing the first semiconductor region to the substrate, said semiconductor sealing layer including an upper semiconductor region and a lower semiconductor region separated by a first dielectric layer, said lower semiconductor region including an external lead semiconductor region connected to the first external electrode and a sealing semiconductor region, said external lead semiconductor region being electrically isolated from the sealed semiconductor region by an isolation trench.

20. The semiconductor device according to claim 19 wherein the upper semiconductor region is isolated from the first semiconductor region by a second dielectric layer.

21. The semiconductor device according to claim 19 wherein the lower semiconductor region is separated from the substrate by a second dielectric layer.

22. The semiconductor device according to claim 19 wherein the first internal electrode is positioned on the first semiconductor region.

23. The semiconductor device according to claim 19 wherein the sealing layer is made of a material from the group consisting of polysilicon, silicides, polysilicides, refractory metals, and combinations thereof.

24. A semiconductor device comprising:
a substrate, said substrate including a first external electrode and a second external electrode formed thereon;
a first semiconductor region sealed to the substrate, said first semiconductor region including a recessed area defining a cavity between a substrate and the first semiconductor region;
at least electrical device positioned within the cavity;
a plurality of internal electrodes positioned within the cavity and being in electrical connection with at least one of the at least one electrical device; and
a polysilicon sealing layer extending around the perimeter of the cavity and sealing the first semiconductor region to the substrate, said polysilicon sealing layer including a first electrical connection region and a second electrical connection region that are electrically isolated from each other, said first electrical connection region including a first upper polysilicon region and a first lower polysilicon region separated by a first dielectric layer, said first and second electrical connection regions being electrically separated by at least one upper level isolation trench in the upper polysilicon region, said first lower polysilicon region including a first internal lead polysilicon region electrically connected to the first internal lead, a first external lead polysilicon region electrically connected to the first external lead, and a center polysilicon region, said center polysilicon region being separated from the first internal lead polysilicon region by a first lower polysilicon region isolation trench and said center polysilicon region being separated from the first external lead polysilicon region by a second lower polysilicon isolation trench, said center polysilicon region being continuous through the first and second electrical connection regions and providing a seal through the first and second electrical connection regions, wherein the first internal lead polysilicon region is in electrical contact with the first upper polysilicon region through a first opening in the first dielectric layer and the first external lead polysilicon region is in electrical contact with the first upper polysilicon region through a second opening in the first dielectric layer so that the first internal lead is in electrical connection with the first external lead, and wherein the combination of the first internal lead polysilicon region, the first upper polysilicon region and the first external lead polysilicon region forms a bridge over the center polysilicon region.

25. The semiconductor device according to claim 24 wherein the second electrical connection region includes a second upper polysilicon region and a second lower polysilicon region separated by a second dielectric layer, said second lower polysilicon region including a second internal lead polysilicon region electrically connected to a second internal lead and a second external lead polysilicon region connected to the second external lead, said center polysilicon region being separated from the second internal lead polysilicon region by a third lower polysilicon region isolation trench and said center polysilicon region being separated form the second external lead polysilicon region by a fourth lower polysilicon isolation trench, wherein the second internal lead polysilicon region is in electrical contact with the second upper polysilicon region through a first opening in the second dielectric layer and the second external lead polysilicon region is in electrical contact with the second upper polysilicon region through a second opening in the second dielectric layer so that the second internal lead is in electrical connection with the second external lead, and wherein the combination of the second internal lead polysilicon region, the second upper polysilicon region and the second external lead polysilicon region forms a bridge over the center polysilicon region.

* * * * *

UNITED STATES PATENT AND TRADEMARK OFFICE
CERTIFICATE OF CORRECTION

PATENT NO. : 5,929,497
DATED : July 27, 1999
INVENTOR(S) : Abhijeet V. Chavan, Kensall D. Wise It is certified that error appears in the above-identified patent and that said Letters Patent is hereby corrected as shown below:

On the Title Page, insert

Joint assignee to read:
    Regents of the University of Michigan
    Ann Arbor, Michigan Signed and Sealed this Eighth Day of May, 2001

*Attest:*

NICHOLAS P. GODICI

*Attesting Officer*    *Acting Director of the United States Patent and Trademark Office*